United States Patent [19]

Miyakawa et al.

[11] Patent Number: 5,384,742
[45] Date of Patent: Jan. 24, 1995

[54] NON-VOLATILE SEMICONDUCTOR MEMORY

[75] Inventors: Tadashi Miyakawa; Masamichi Asano, both of Tokyo, Japan

[73] Assignee: Kabushiki Kaisha Toshiba, Kawasaki, Japan

[21] Appl. No.: 30,343
[22] PCT Filed: Sep. 25, 1991
[86] PCT No.: PCT/JP91/01272
  § 371 Date: Mar. 25, 1993
  § 102(e) Date: Mar. 25, 1993
[87] PCT Pub. No.: WO92/05560
  PCT Pub. Date: Apr. 2, 1992

[30] Foreign Application Priority Data

Sep. 25, 1990 [JP] Japan .................. 2-254750

[51] Int. Cl.⁶ .................................... G11C 7/00
[52] U.S. Cl. .................... 365/218; 365/185; 365/900
[58] Field of Search ............ 365/104, 185, 218, 900, 365/230.03

[56] References Cited

U.S. PATENT DOCUMENTS 5,051,953 9/1991 Kitazawa et al. ............ 365/185
5,103,425 4/1992 Kuo et al. .................. 365/900 X
5,109,361 4/1992 Yim et al. ................... 365/900 X

FOREIGN PATENT DOCUMENTS 052566 5/1982 European Pat. Off. .
2235999 3/1991 United Kingdom .

OTHER PUBLICATIONS

IEEE International Solid–State Circuits Conference, Feb. 1989, No. 32, pp. 132–133, 313, "A 5V only 256K Bit CMOS Flash EEPROM", D'Arrigo et al.
Patent Abstracts of Japan, vol. 13, No. 146 (P–854), 11, Apr. 1989, 63–308797, Dec. 16, 1988.
"A 1Mb FLASH EEPROM", Raul–Adrian Cernea et al., IEEE International Solid–State Circuit Conference 1989, pp. 138–139.

Primary Examiner—Joseph A. Popek
Attorney, Agent, or Firm—Foley & Lardner

[57] ABSTRACT

A memory cell array is divided into a plurality of blocks. In altering data for a block (selected block), a moderating voltage is applied to the source or control gate of a memory cell in another block (non-selected block) to moderate stress between the floating gate and source/drain, thereby preventing write error and erase error. In the program operation, the source and drain of a memory cell in the non-selected block are equalized to moderate an electric field between the control gate and source/drain and not to flow a channel current, thereby preventing write error. In carrying out a negative voltage erase method, prior to setting the source line and word line of a cell in a non-selected block to an erase voltage, the source and word lines are equalized. The equalization operation is released after the erase operation, thereby preventing malfunction of a non-selected cell.

23 Claims, 27 Drawing Sheets

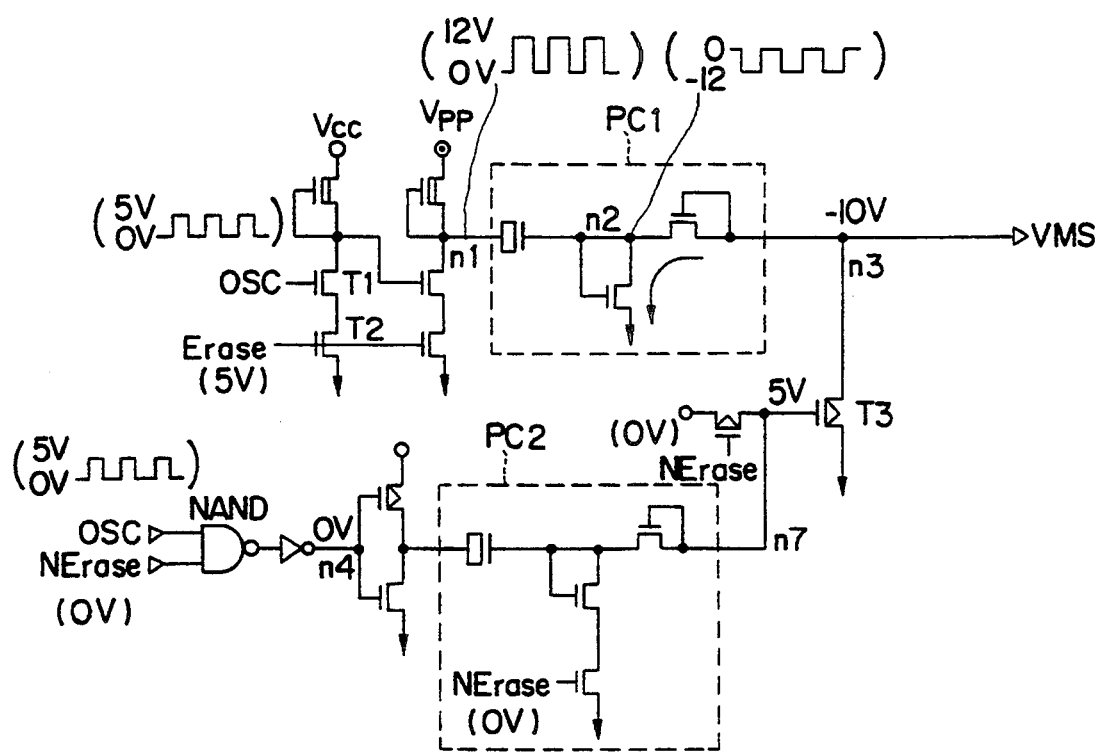
F I G. 21A

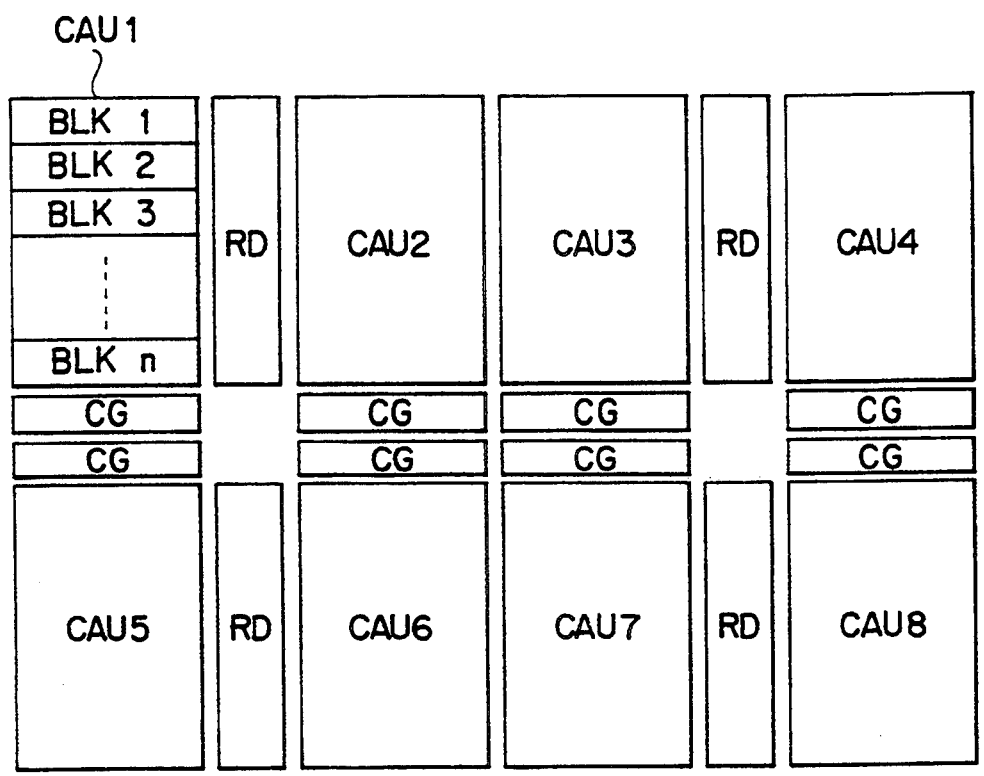
F I G. 23

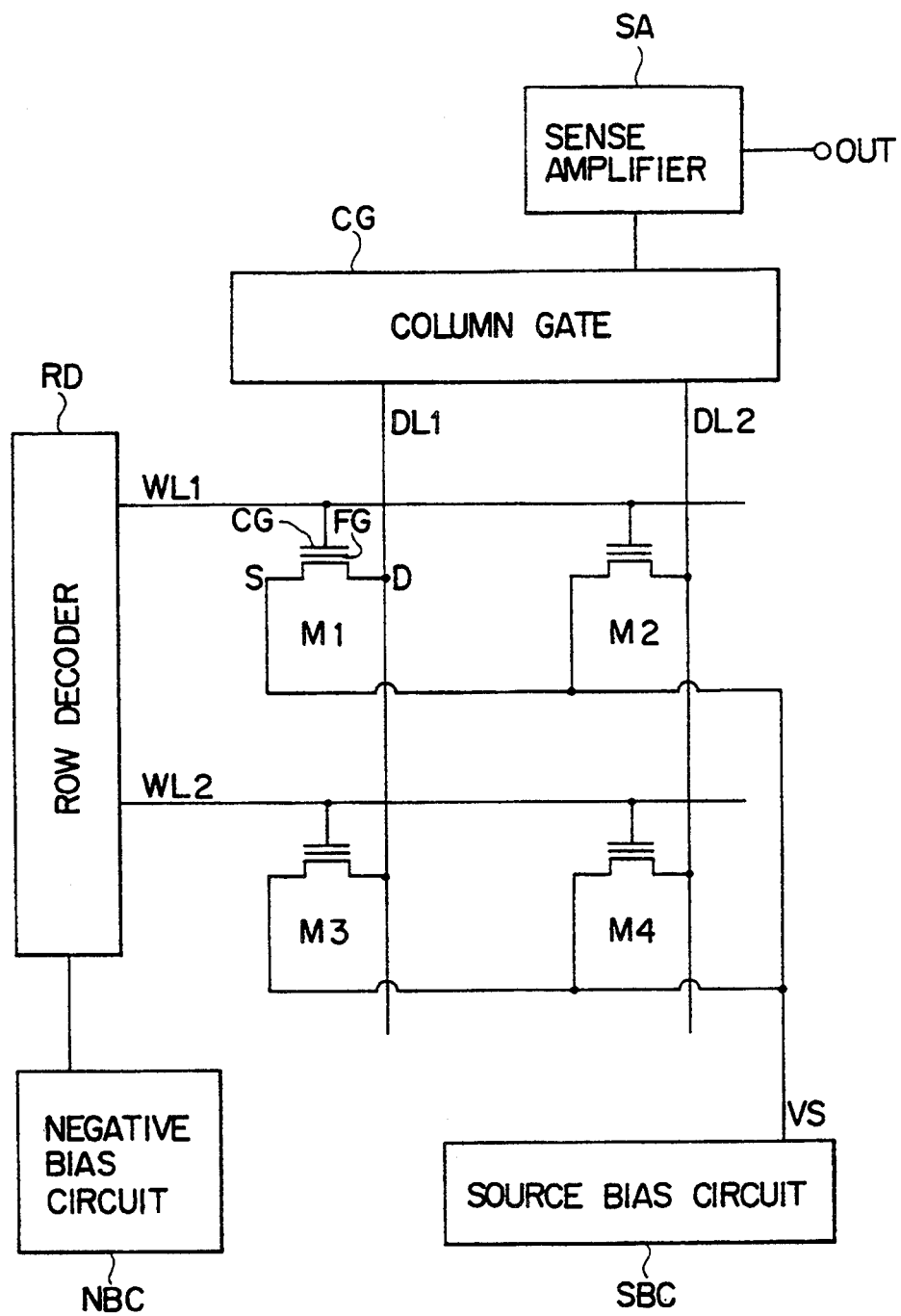
F I G. 24

NON-VOLATILE SEMICONDUCTOR MEMORY

The present invention relates to a non-volatile semiconductor memory, and more particularly to a non-volatile semiconductor memory having a plurality blocks of non-volatile memory cells of two-layered structure, capable of altering data in units of blocks.

BACKGROUND OF THE INVENTION

All-bit flash erase type memories have drawn attention as electrically erasable, programmable read-only memories (E$^2$PROM). Recent requirements for such memories are to provide a function for altering data in each of a plurality of memory blocks in units of blocks. For example a 4M bit device is divided into 16 blocks each having 32K bytes or into 4 blocks each having 256K bytes, and data erasure is required to be performed on the blocks per unit basis. With such block division of a cell array, cells in a plurality of different blocks are connected to the same word line or data line. Therefore, repeating write/erase of a particular block may apply stress to cells in other non-selected blocks.

The degree of such stress will be discussed for cells of two-layered structure. In the case of cells of two-layered structure used in a flash type E$^2$PROM, data write is performed in a manner similar to EPROM. Namely, a control gate is applied with $V_{CG}=12$ V, a drain with $V_D=6$ V, and a source with $V_S=0$ V. In this state, hot electrons generated by an avalanche effect are injected to the floating gate. For data erase, the control gate is applied with $V_{CG}=0$ V, the source with $V_S=12$ V. In this state, electrons are taken out of the floating gate as F-N tunnel current between the floating gate and source.

The characteristic structure of such a cell resides in that the gate oxide film under the floating gate is about 100 angstroms thinner than that of an EPROM cell because a tunnel current flows between the floating gate and source during data erase, and that the superposing area of the source n+ region and the floating gate is made wider than that of EPROM.

In a cell array having a plurality of blocks comprised by cells of such structure, stress applied to a cell in an erase state or write state in a non-selected block is shown in Table 1. A cell in an erase state in a non-selected block connected to a selected word line is applied to an electric field of about 7.5 MV/cm between its floating gate and source, and a cell in a write state in a non-selected block connected to a selected data line is applied to an electric field of about 6.5 MV/cm between its floating gate and drain.

Next, there will be discussed the time period while stress is applied to a cell in a non-selected block during data erase or data write. Consider a 4M bit device divided into blocks at intervals of 32K bytes in the data line direction. Assuming that cells in a block are subject to write/erase as many as $10^5$ times with a write time of 10 μs and write occurrence frequency of 25 times for each cell, a cell in a non-selected block is applied with $V_{CG}=12$ V during the total time period of 800 sec. Stress of 7.5 MV/cm is therefore applied between the floating gate and source during the time period 800 sec, inevitably leading to write error. As an alternate, consider a 4M bit device divided into blocks at intervals of 32K bytes in the word line direction, a cell in a non-selected block is applied with 6 V at its drain during the total time period 6400 sec. Stress of 6.5 MV/cm is therefore applied between the floating gate and drain during the time period 6400 sec, inevitably leading to erase error.

As described above, a conventional device is associated with the problem that as data write and erase are effected to a selected block, data write error and erase error may occur at non-selected blocks.

In a conventional data erase scheme, electrons accumulated in a floating gate FG are emitted toward the source by applying a high voltage to the cell source, as discussed previously. With this scheme, it is unable to use a source voltage equal to or higher than the breakdown voltage of a source junction, there arises some restriction that cell sources are required to be formed separately in order to allow block erase (simultaneous erase of a plurality of cells contained within one block). Another scheme using a negative voltage has been considered which can erase data without applying a high voltage to the cell source. An apparatus performing such scheme is conceptually shown in FIG. 24, and timings of waveforms used by the apparatus are shown in FIG. 25. Table 2 shows examples of voltages set to cells at different modes.

TABLE 2

| Mode | Cell | WL | DL | Source |
|---|---|---|---|---|
| Erase | Selected Cell | −10 V | 3 V | 5 V |
|  | Non-selected Cell | 5 V | 3 V | 5 V |
| Program | Selected Cell | 12 V | 6 V | 0 V |
| Read | Selected Cell | 5 V | 1 V | 0 V |

This scheme is characterized in that a plurality of memory cells connected to one selected word line can be erased at the same time. It is now assumed that a word line WL$_1$ is selected and another word line WL$_2$ is not selected in a data erase mode. Specifically, the selected word line WL$_1$ is applied with a voltage VWL$_1$ of −10 V, the non-selected word line WL$_2$ is applied with a voltage VWL$_2$ of 5 V, a source voltage VS is set to 5 V, and data lines DL$_1$ and DL$_2$ are set to a floating state. In this state, memory cells M1 and M2 enter an erase state, and memory cells M3 and M4 enter a non-erase state. In a program mode (in a data write mode), hot electrons are injected into a floating gate FG. In a

TABLE 1

|  |  | Control Gate Voltage $V_{CG}$ | Drain Voltage $V_D$ | Source Voltage $V_S$ | Floating Gate Voltage $V_{FG}$ | Stress Potential Difference | |
|---|---|---|---|---|---|---|---|
|  |  |  |  |  |  | $V_{FG} - V_D$ | $V_{FG} - V_S$ |
| Cell in Erase State |  | 0 V | 0 V | 0 V | 1 V | — | — |
| Cell in Write State |  | 0 V | 0 V | 0 V | −1.2 V | — | — |
| Non-selected Block Same Word Line | Erase cell | 12 V | Open | 0 V | 7.4 V | — | 7.4 V |
|  | Write cell | 12 V | Open | 0 V | 5.2 V | — | 5.2 V |
| Non-selected Block Same Data Line | Erase cell | 0 V | 6 V | 0 V | 3.2 V | 2.8 V | — |
|  | Write cell | 0 V | 6 V | 0 V | −0.4 V | 6.4 V | — | read mode, a sense amplifier judges whether a selected cell is being turned on (a cell current flows) or off (a cell current will not flow).

The above-described scheme has the following problems. At the non-selected cells M3 and M4 in the erase mode, $WL_2$ is set to 5 V, VS is set to 5 V, and $DL_1$ and $DL_2$ enter the floating state. As a result, the data lines $DL_1$ and $DL_2$ are charged via the non-selected cells M3 and M4 up to $(5\ V - V_{th})$ where $V_{th}$ is a cell threshold value. A cell current for charging the data lines $DL_1$ and $DL_2$ flows in the non-selected cells M3 and M4 during the time period from $t_1$ to $t_2$, therefore leading to a possibility of write error at the non-selected cells M3 and M4. Also in the end of erase mode, electric charges used for charging the data lines $DL_1$ and $DL_2$ are discharged so that a cell current will flow during the time period from $t_3$ to $t_4$, leading to a possibility of write error. In addition, if charge/discharge relative to the source and word lines is carried out rapidly, a peak current will flow which may break wiring material.

SUMMARY OF THE INVENTION

It is an object of the present invention to provide a non-volatile semiconductor memory capable of preventing malfunction such as write error, erase error and the like, during the data write and data erase.

It is another object of the present invention to provide a non-volatile semiconductor memory capable of preventing malfunction of a non-selected memory cell upon data write or erase for an optional number of memory cells selected from a plurality of memory cells.

It is a further object of the present invention to provide a non-volatile semiconductor memory wherein the memory cell are divided into a plurality of blocks each having a plurality of memory cells, data can be altered on the block unit basis, and malfunction of a cell in a non-selected block can be prevented even if data in a cell in a selected block is written or erased.

A memory cell array is divided into a plurality of blocks. In altering data for a block (selected block), a moderating voltage is applied to the source or control gate of a memory cell in another block (non-selected block) to moderate stress between the floating gate and source/drain, thereby preventing write error and erase error.

In the program operation, the source and drain of a memory cell in the non-selected block are equalized to moderate an electric field between the control gate and source/drain and not to flow a channel current, thereby preventing write error.

In carrying out a negative voltage erase method, prior to setting the source line and word line of a cell in a non-selected block to an erase voltage, the source and data lines are equalized. The equalization operation is released after the erase operation, thereby preventing malfunction of a non-selected cell.

BRIEF DESCRIPTION OF THE DRAWINGS

FIGS. 21A and 21B illustrate the state of the negative bias circuit shown in FIG. 16 during the erase mode and other modes.

FIG. 23 is a conceptual diagram showing the overall arrangement of another embodiment according to the present invention.

FIG. 24 is a conceptual diagram of a conventional memory device.

PREFERRED EMBODIMENT OF THE INVENTION

Figure 1:
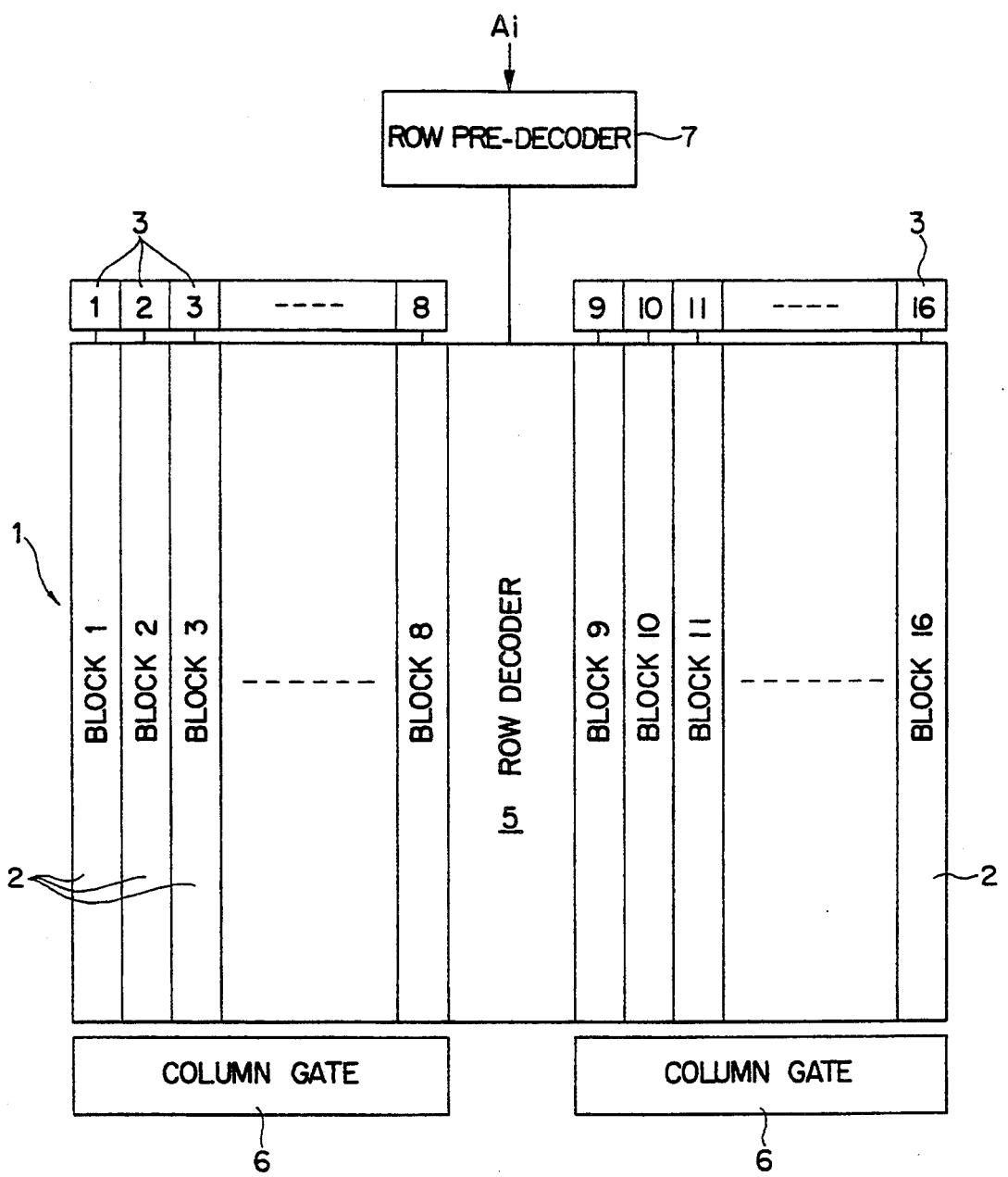
FIG. 1 is a diagram showing the overall arrangement of an embodiment according to the present invention.
Figure 2:
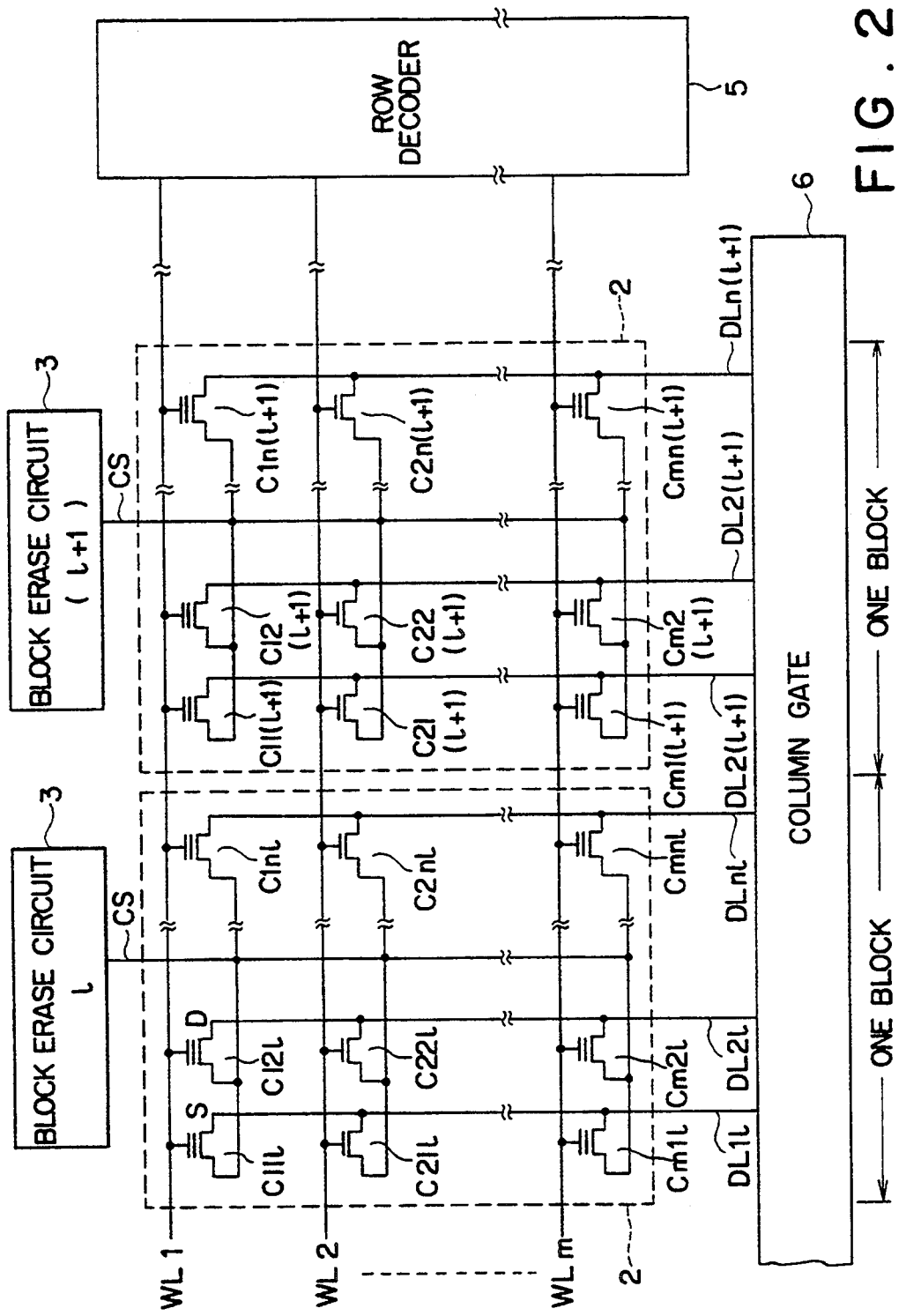
FIG. 2 is a circuit diagram showing the details of a portion of the embodiment shown in FIG. 1.

FIG. 1 shows a device whose memory cell array is divided into sixteen block in the data line direction according to the first embodiment. The memory cell array 1 is divided into sixteen blocks 2 each provided with a block erase circuit 3. In FIG. 1, reference numeral 5 represents a row decoder, reference numeral 6 represents a column decoder, and reference numeral 7 represents a row pre-decoder. The details of each block 2 are shown in FIG. 2. As seen from FIG. 2, each block erase circuit 3 is commonly connected to the sources of cells $C_{xy}$ in each block 2. Cells commonly connected to one data line $DL\alpha\beta$ are located within the same block. Cells commonly connected to one word line $WL_i$ are located over a plurality of blocks.

A data alteration operation of one block of the device constructed as above will be described below.

In the erase sequence for cells of two-layered structure described above, in order to prevent a read error of a cell due to transformation to the depletion type of a cell to be caused by over erase, all cells in a subject block are first written with data and then erased at the same time. In a write mode, a sequence similar to the case of EPROM is executed. In other words, for the data alteration, a write operation is carried out twice. In this case, stress is applied to the control gates of cells in non-selected blocks connected to the same word line of the block to be altered.

In this embodiment, in order to moderate an electric field between the floating gates and sources of cells in an erase state in non-selected blocks, a predetermined potential (moderating potential) is applied to the cell sources. For example, if a potential of 2 V is applied to a cell source, the electric field between the floating gate and source becomes about 5 MV/cm which moderates the electric field by about 2.5 MV/cm as compared with about 7.5 MV/cm when 0 V is applied to the cell source.

Figure 3:
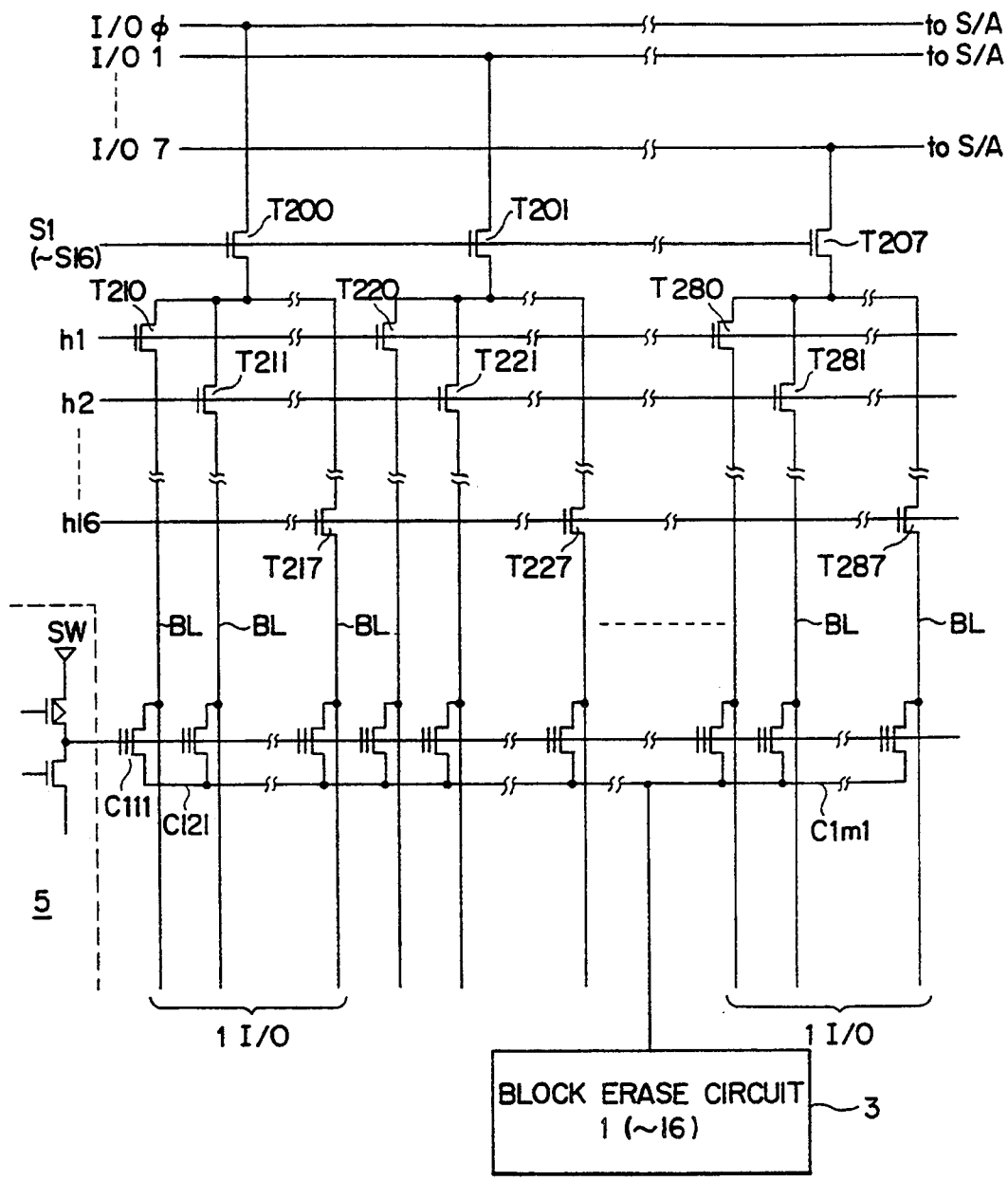
FIG. 3 is a circuit diagram showing the details of the column gate section.

FIG. 3 shows the structure of the column gate. FIG. 3 corresponding to FIG. 1 shows the column structure of one block, a row decoder buffer, a word line, and cells $C_{111}$ to $C_{1m1}$ connected to the word line. This device is obtained, for example, by dividing a 4 M bit cell array into sixteen blocks in the data line direction at intervals of 35K bytes. One block has 128 data lines for 8 I/O units each I/O assigned 16 data lines. One byte is selected by one of column signals h1 to h16. Each block is selected by one of column signals s1 to s16.

In FIG. 3, T200 to T207 represent column gate transistors for selecting a block, and T210 to T287 represent column gate transistors selected by the column signal h1 to h16.

Figure 4:
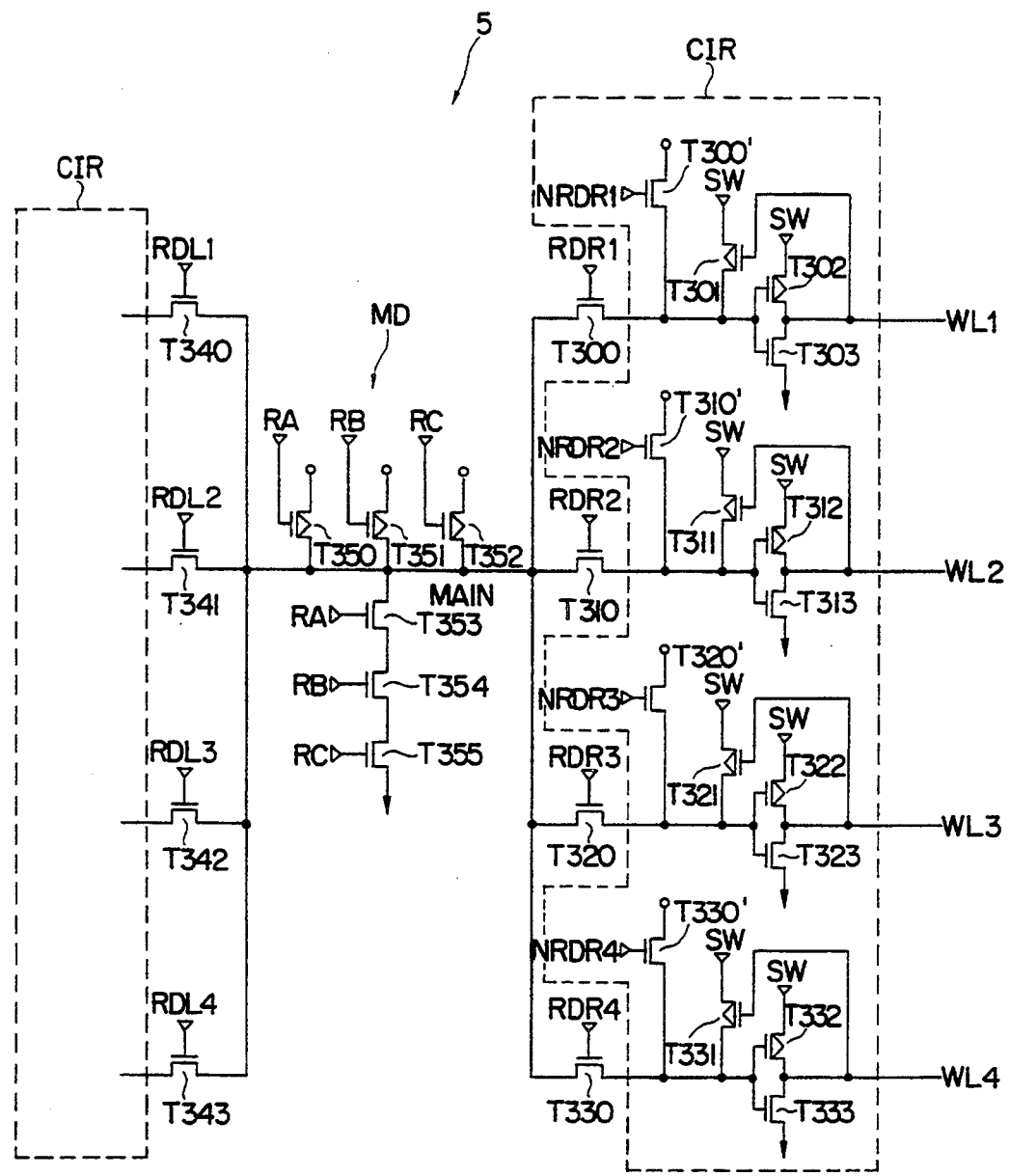
FIG. 4 is a circuit diagram showing the main portion of the row decoder.

FIG. 4 shows the structure of the row decoder 5.

In FIG. 4, MD represents a main decoder having a plurality of transistors T350 to T355 and selected by outputs RAi, RBi and RCi from the row pre-coder, T300, T310, T320, T330, T340 to T343 represent transfer gates selected by outputs $RDR_i$ and $RDL_i$ from the row predecoder, T300', T310', T320', and T330' represent charge transistors, T301 to T303, T311 to T313, T321 to T323, and T331 to T333 represent feedback-type inverters. A circuit CIR at the left side of FIG. 4 has the same structure as the circuit CIR at the right side.

If a word line $WL_1$ for example is to be selected, the main decoder MD selected by the outputs RAi, RBi, and RCi takes a state of RA=RB=RC="H", so that a node MAIN becomes "L". $RDR_1$ for selecting the word line $WL_1$ becomes "H", and $NRDR_1$ becomes "L". Other $RDR_2$ to $RDR_4$ become "L", and other $NRDR_2$ to $NRDR_4$ become "H". As a result, the transistor T302 turns on and the transistor T303 turns off, so the word line $WL_1$ takes an SW potential. At this time, the transistors T312, T322, and T332 turn off T313, T323, and T333 turn on, so the other word lines $WL_2$ to $WL_4$ take a ground level.

In the memory device having divided blocks according to the embodiment of the present invention, first to eighth blocks 2 and ninth to sixteenth blocks 2 are grouped on opposite sides of the row decoder 5 as shown in FIG. 1. The right transfer gate RDRi executes a logical calculation with a block selecting column signal Si to drive only the right word line connected to the selected block. Similarly, the left transfer gate RDLi executes a logical calculation with the block selecting column signal Si to drive only the left word line connected to the selected block.

Figure 5:
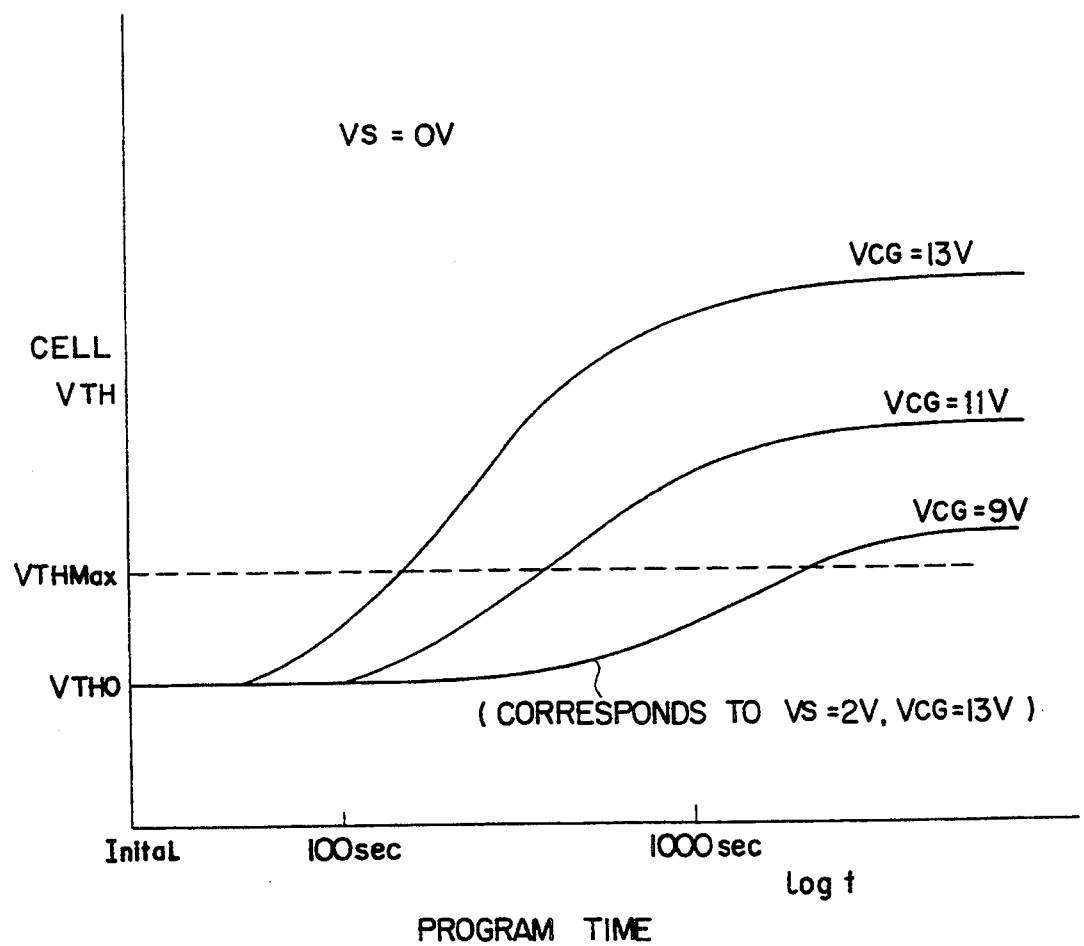
FIG. 5 is a graph showing the characteristics of a memory cell in a non-selected block.

FIG. 5 is a graph showing the relationship between time duration of stress applied to the control gate of an erased cell in a non-selected block and a change in cell $V_{TH}$. The cell source is assumed to be set to 0 V. As the control gate stress time period becomes long, the cell $V_{TH}$ rises. This rise is dependent upon the control gate potential. For $V_{CG}=13$ V, a large rise is observed at about 100 sec. For $V_{CG}=9$ V on the other hand, a rapid rise will not be observed up to 1000 sec. The above cases are observed when setting the cell source to 0 V. If the cell source is set to 2 V, the characteristics obtained at the electric field between the floating gate and source corresponding to $V_{CG}=13$ V are substantially equal to the characteristics obtained at the electric field corresponding to $V_{CG}=9$ V and cell source set to 0 V.

Assuming that the coupling ratio $C_{cf}$ is 0.5 between the control gate and floating gate and the coupling ratio $C_{sf}$ is 0.1 between the source and floating gate, the floating gate potential $V_{FG}$ at the cell source set to 0 V and $V_{CG}=13$ V becomes:

$$V_{FG}=C_{cf} \times V_{CG}=6.5 \text{ V},$$

and so the electric field $E_{sf}$ between the source and floating gate becomes 6.5 MV/cm. At the cell source set to 0 V and $V_{CG}=9$ V, then $V_{FG}$ becomes 4.5 V and $E_{sf}$ becomes 4.5 MV/cm. If the cell source is set to 2 V and $V_{CG}=13$ V, then the floating gate potential $V_{FG}$ becomes:

$$\begin{aligned}V_{FG} &= V_{CG} \times C_{cf} + V_s \times C_{sf} \\ &= 13 \times 0.5 + 2 \times 0.1 = 6.7 \text{ V},\end{aligned}$$

and so $E_{sf}=6.7-2=4.7$ MV/cm.

As described above, by raising the cell source potential of a non-selected block by about 2 V, it is possible to sufficiently suppress the variation of the $V_{TH}$ of a cell in an erase state.

The terms $V_{THO}$ and $V_{THMax}$ are herein introduced, the term $V_{THO}$ being a $V_{TH}$ of a cell in an erase state without no stress, and the term $V_{THMax}$ being a limit $V_{TH}$ of a cell providing no access time delay and no read error.

If there is provided no effective countermeasure for a cell source, the cell $V_{TH}$ becomes $V_{THMax}$ at $V_{CG}=13$ V and in stress time period of about several hundreds sec. In contrast, if a countermeasure for raising a potential at a cell source, the cell $V_{TH}$ will not reach $V_{THMax}$ even at $V_{CG}=13$ V and in stress time period of about 1000 sec or longer, by raising to $V_s=2$ V which corresponds to a drop of $V_{cg}=4$ V.

If data alteration is repeated $10^5$ times to a particular block of a memory device divided as shown in FIG. 1, the stress time period of cells in a non-selected block is about 800 sec, enabling to prevent malfunction to be caused by stress.

Figure 6:
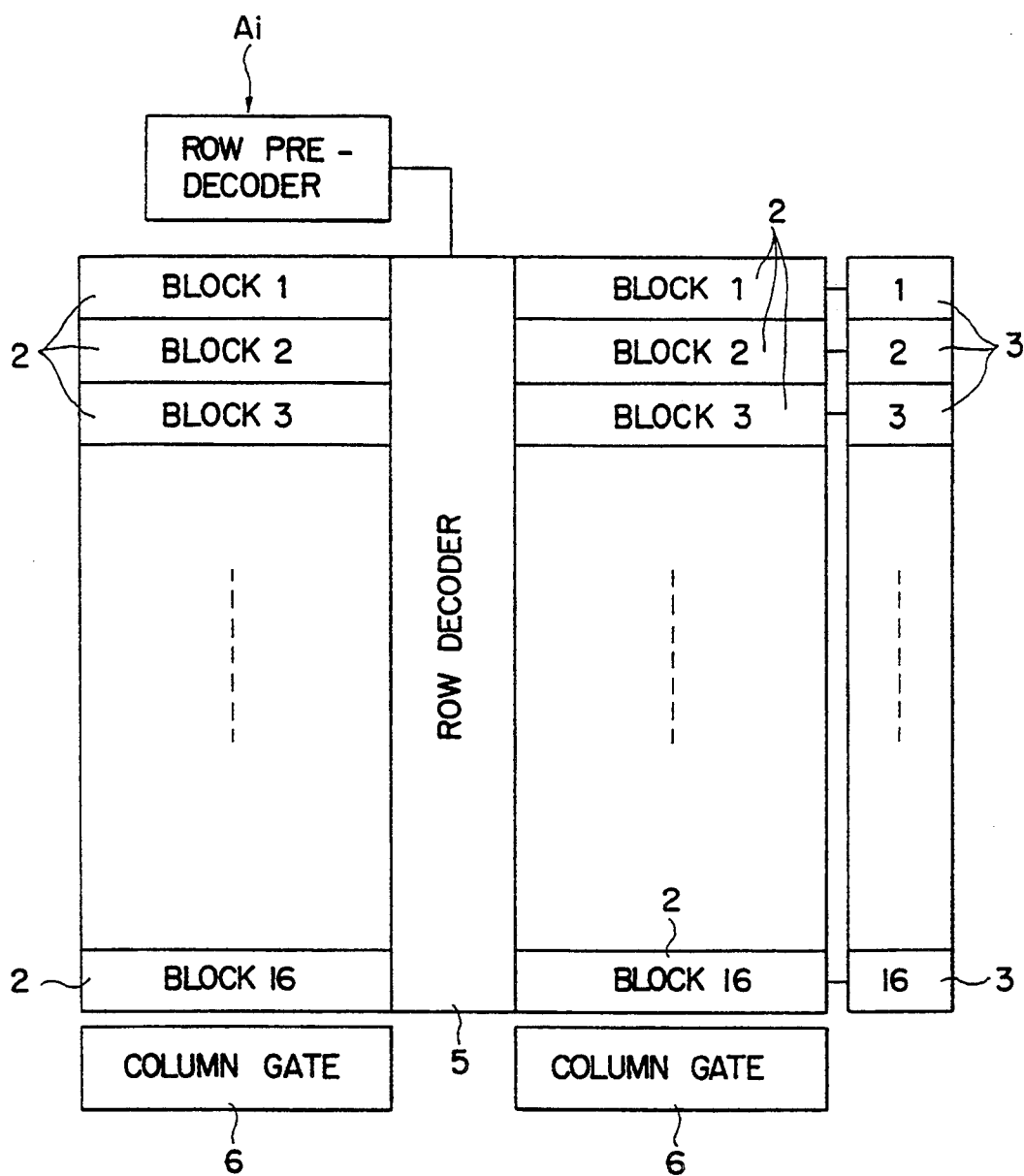
FIG. 6 is a diagram showing the overall arrangement of another embodiment according to the present invention.

Next, the second embodiment will be described with reference to FIG. 6.

Figure 7:
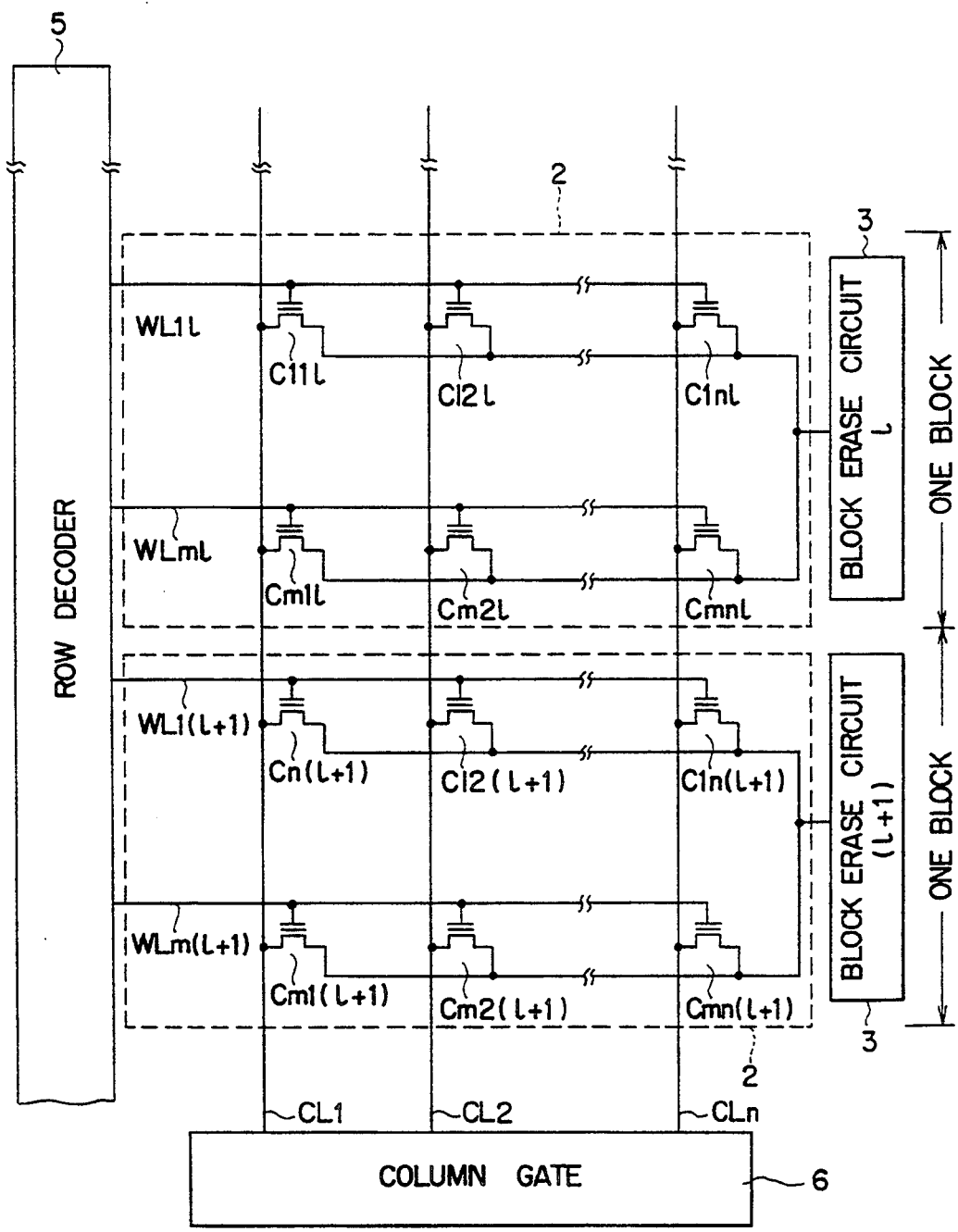
FIG. 7 is a circuit diagram showing the details of a portion of the embodiment shown in FIG. 6.

In this embodiment, different from the first embodiment, a memory cell array is divided into blocks in the word line direction. Similar to the first embodiment, a block erase circuit 3 is provided at each block. The layout of cells is shown in FIG. 7. Cells C commonly connected to a word line WL are located within the same block. On the other hand, cells C commonly connected to a data line CL are located over a plurality of blocks. With such an arrangement, one data line CL is commonly connected to all corresponding cells in first to sixteenth blocks. A row decoder 5 selects a particular block 2 by applying a high potential to a word line WL of the block 2, while raising the potentials of other word lines WL in non-selected blocks to a potential, for example, a potential half that of the word line WL of the selected block. Such a circuit for raising the potential of word lines of non-selected blocks may use any general circuit for raising a word line potential.

In the present embodiment, stress can be moderated by setting the control gate of a cell in a non-selected block to $V_{CG} = 5$ V.

A cell in a write state in a non-selected block takes a value 5.6 MV/cm at $V_{CG} = 0$ V and $V_{FG} - V_D = 5.6$ V, and a value 3.8 MV/cm at $V_{CG} = 5$ V and $V_{FG} - V_D = 3.8$ V, which provides an electric field moderation of 1.8 MV/cm.

The following advantageous effects can be obtained by the present embodiment.

Stress applied to a cell in a non-selected block can be moderated even in the case of a flash-type E$^2$PROM cell array divided into blocks for data alteration on the block unit basis. For example, even if data alteration is repeated 10$^5$ times with respect to a particular block, the $V_{TH}$ variation of a cell in a non-selected block can be sufficiently suppressed. The time period required for a cell to reach $V_{THMAX}$ at which a malfunction may occur, is elongated several ten times at $V_{CG} = 13$ V for example, providing an ample margin during 10$^5$ write/erase cycles.

In addition to a conventional all bit flash erase operation, an erase on the block unit basis is possible, providing value-added performance and an increased number of write/erase cycles with high reliability.

Next, another embodiment will be described with reference to FIGS. 8 to 14. In this embodiment shown therein, during a program mode, the source and drain of a memory cell in a non-selected block are biased to the same potential at the same time to moderate the electric field between the control gate and source/drain and not to flow a channel current, thereby preventing write error and improving the reliability.

Figure 8:
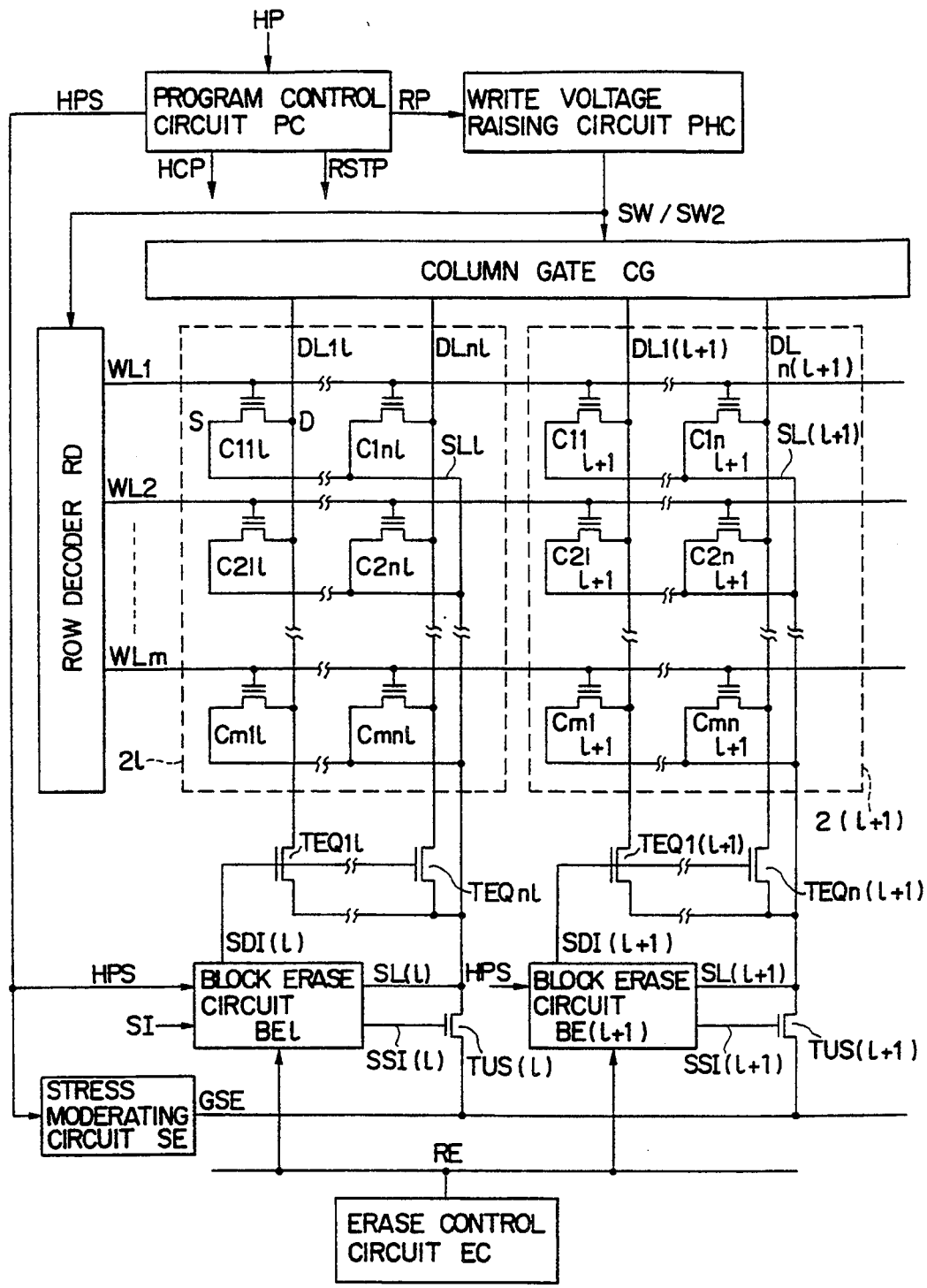
FIG. 8 is a diagram showing the overall arrangement of another embodiment according to the present invention.

FIG. 8 shows the overall structure of this embodiment. In FIG. 8, a cell array is divided into a plurality of blocks $2i$ ($2_1$, $2_2$, ...) in the data line $DL_i$ direction. This memory device is provided with a stress moderating circuit SE shared by all blocks, and block erase circuits $BE_1$, $BE_2$, ... connected to corresponding source lines $SL_1$, $SL_2$, ... of respective blocks. Consider now one block 21, the source line $SL_1$ is connected to data lines $DL_{11}$ to $DL_{n1}$ via transfer gates $TEQ_{11}$ to $TEQ_{n1}$ to the gates of which an output signal SDI(1) from the block erase circuit $BE_1$ is applied. An output (GSE) of the stress moderating circuit SE is connected to the source line $SL_1$ via a transfer gate TUS(1) to the gate of which an output signal SSI(1) of the block erase circuit $BE_1$ is applied. The other blocks are constructed in substantially the same as the block 21. In FIG. 8, PC represents a program control circuit, PHC represents a write potential raising circuit, CG represents a column gate, RD represents a row decoder, and EC represents an erase control circuit.

The operation of the memory device constructed as above will be described. It is assumed that the block 21 is selected and a cell $C_{111}$ is selected to write data therein. In other words, it is assumed that in this selected block 21, the selected word line $WL_1$ and data line $DL_{11}$ are connected to the write potential raising circuit PHC via the row decoder RD and column gate CG to write data in the selected cell $C_{n1}$. The output signals SDI(1) and SSI(1) of the block erase circuit $BE_1$ of the selected block 21 take a level "L", and the source line $SL_1$ is disconnected from the data line $DL_{11}$ and from the output (GSE) of the stress moderating circuit. In a nonselected block, e.g., block 2(1+1), the output signals SDI(1+1) and SSI(1+1) of the block erase circuit BE(1+1) take a level "H", so the transistors $TEQ_1(1+1)$ to $TEQ_n(1+1)$ and TUS(1+1) turn on. The source line SL(1+1) and data lines $DL_1(1+1)$ to $DL_n(1+1)$ are connected to the stress moderating circuit SE. Accordingly, the source and drain of each cell are set to about 2 V set by the stress moderating circuit SE. In this manner, in all non-selected blocks, the electric field between the cell gate and source/drain of each cell on the selected word line $WL_1$ is moderated.

Next, the timing for moderating stress in a non-selected block, e.g., block 2(1+1) will be described. In order to moderate gate stress of a cell in the non-selected block 2(1+1) during the write operation, it is necessary to raise the source/drain voltage $V_{SD}(1+1)$ prior to a rise of the word line $WL_1$, and to lower the source/drain voltage $V_{SD}(1+1)$ after a fall of the word line $WL_1$. As the timing for an equalizer, the source/drain is equalized prior to charging by the stress moderating circuit SE, and the equalization is released after completion of discharging the source/drain. Namely, in the program operation, an input HP to the program control circuit PC takes a level "H" to start the operation of a series of program-operation circuits. In the non-selected block 2(1+1), the output signals SDI(1+1) and SSI(1+1) take a level "H", and the transistors $TEQ_1(1+1)$ to $TEQ_n(1+1)$ and TUS(1+1) turn on. As a result, the source/drain is equalized and connected to the stress moderating circuit SE. At the same time, the stress moderating circuit SE starts operating to charge the source/drain to a predetermined potential. The word line $WL_1$ potential rises after the source/drain potential is raised to a predetermined value. At the end of the program operation, after the word line $WL_1$ potential lowers, the output SSI(1+1) of the block erase circuit BE(1+1) takes a level "L". Then, the transistor TUS(1+1) turns off to disconnect the stress moderating circuit SE and the source/drain. After the source/drain potential lowers, the output SDI(1) of the block erase circuit BE(1+1) takes a level "L", so that the transistors $TEQ_1(1+1)$ to $TEQ_n(1+1)$ turn off to release the equalization of the source/drain. With the timings set as described above, the electric field between the control gate and source/drain can be moderated without flowing a channel current through the non-selected cell, while sufficiently suppressing an occurrence of write error.

Figure 9:
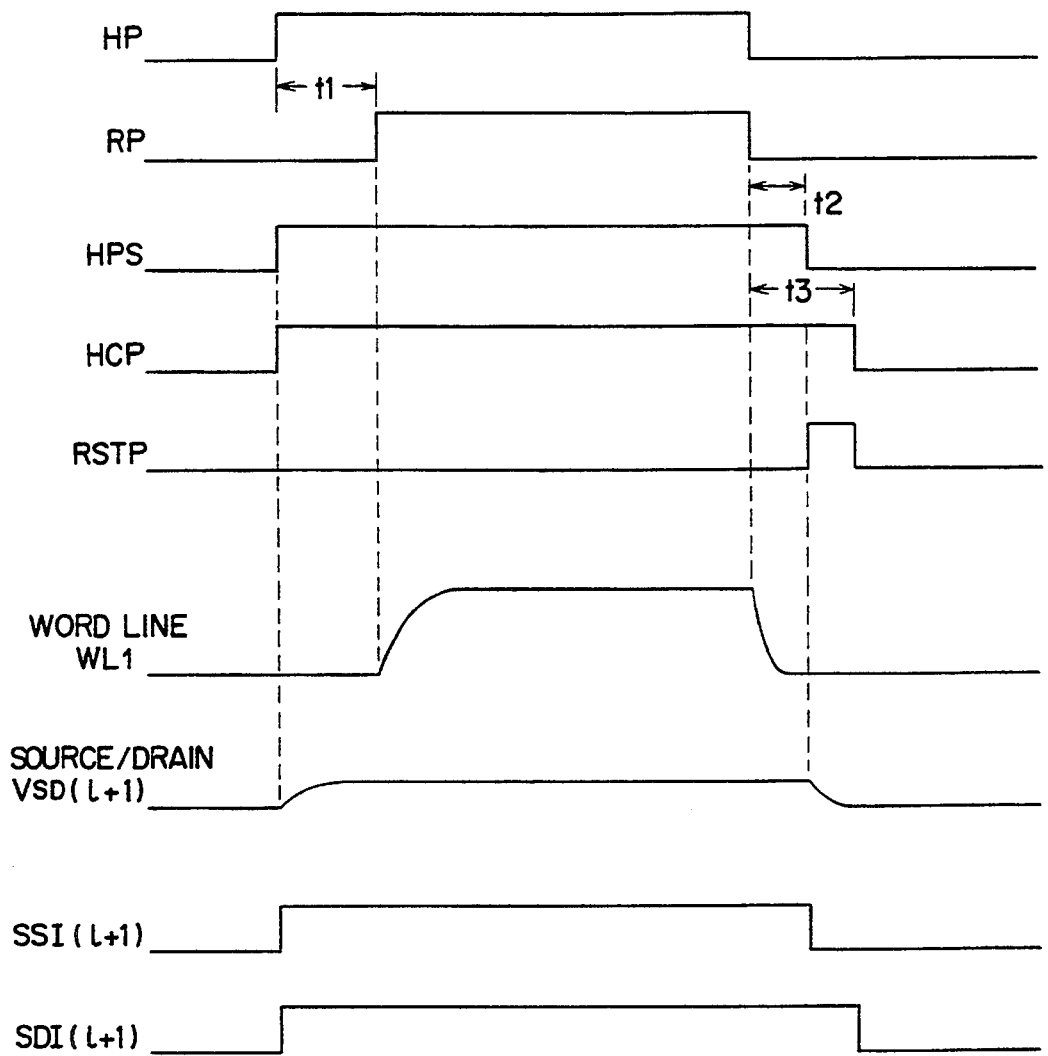
FIG. 9 is a timing chart explaining the operation of the embodiment showin in FIG. 8.

FIG. 9 is a timing chart of an input signal HP to, and output signals RP and HSP from, the program control circuit PC, a potential at the word line $WL_1$, a cell source/drain potential, and the output signals SSI(1+1) and SDI(1+1) of the block erase circuit BE(1+1). The input signal HP is a program signal which takes a level "H" when a program instruction is supplied to the memory device. The signal RP is a signal for driving a program potential raising circuit, which signal rises at a time delayed by a predetermined time $t_1$ from a rise of the input signal HP, and falls simultaneously with a fall of the input signal HP. The signal HPS is a signal for driving the block erase circuit BEi and the stress moderating circuit SE, which signals rises simultaneously with a rise of the input signal HP, and falls at a time delayed by a predetermined time $t_2$ from a fall of the input signal HP. The signal HCP takes a level "H" from the start of the program operation to when the voltages applied to the word line $WL_1$, data line $DL_1$, and source line are discharged, rises simultaneously with a rise of the signal HP, and falls at a time delayed by a predetermined time $t_3$ from a fall of the signal HP. The signal RSTP is a pulse signal which is outputted during the period from when the signal HPS falls upon reception of a discharge signal of the data line $DL_{11}$ at the end of the program operation to when the data line $DL_{11}$ is completely discharged. In the above-described timings, the delay times $t_1$, $t_2$, and $t_3$ are set as $t_3 \geq t_1 > t_2$. The word line $WL_1$ is controlled by the signal RP such that it rises and falls synchronously with the signal RP. The charge/discharge of the source line and data line $DL_{11}$ is controlled by the signal HPS, and is connected to and disconnected from the stress moderating circuit SE via the transistor TUS(1+1) to the gate of which the signal SSI(l) is applied. The equalization between the source line SL(1+1) and data lines $DL_1(1+1)$ to $DL_n(1+1)$ is performed during the period from the start to end of the program operation. The equalization signal SDI(1+1) changes synchronously with the signal HCP.

Figure 10:
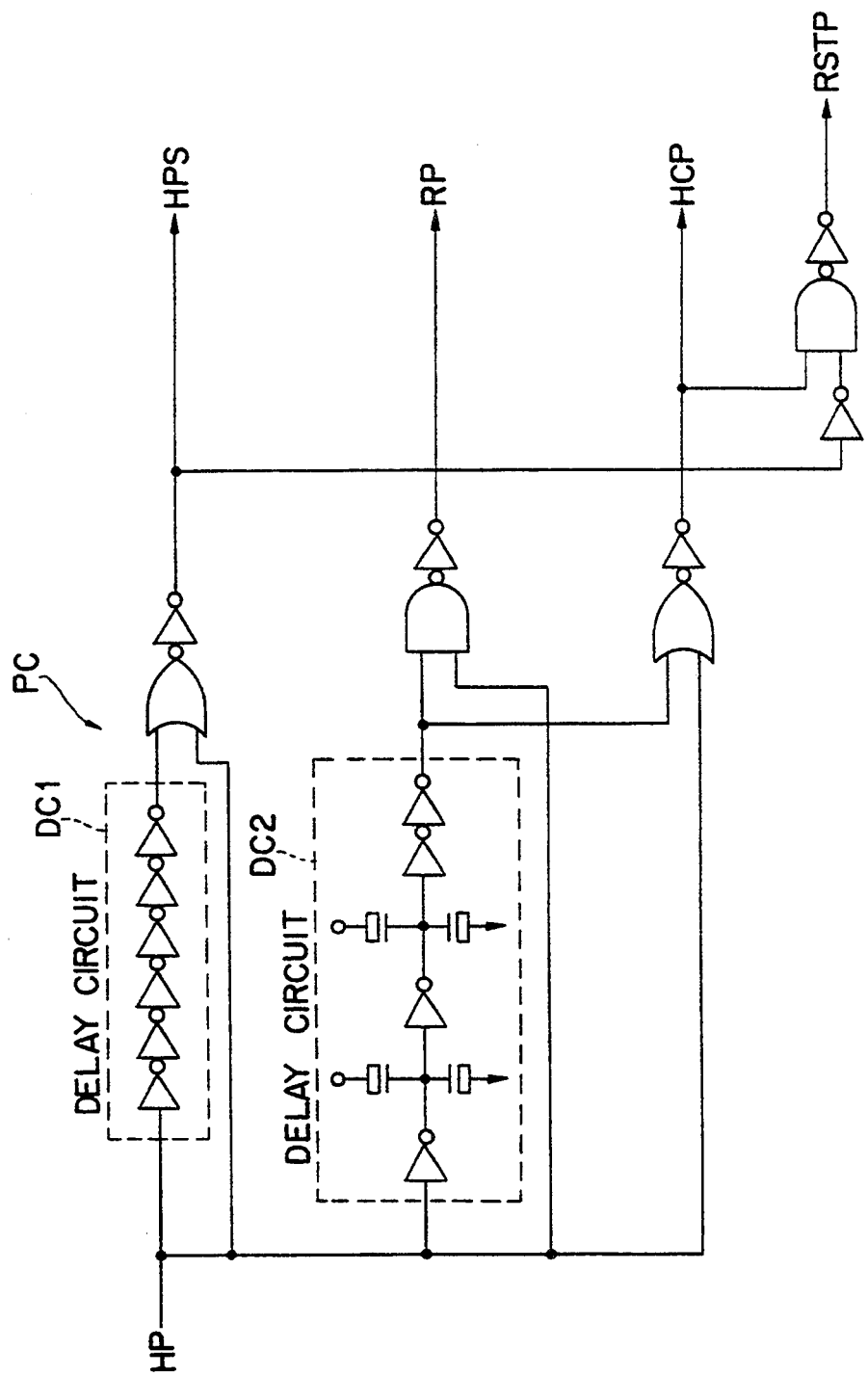
FIG. 10 is a circuit diagram of the program control circuit shown in FIG. 8.

FIG. 10 shows an example of the program control circuit PC shown in FIG. 8. The program control circuit PC outputs the signals HPS, RP, HCP, and RSTP respectively shown in FIG. 9. In this example, a delay circuit $DC_1$ sets the delay time $t_1$ and $t_3$, and another delay circuit $DC_2$ sets the delay time $t_2$.

Figure 11:
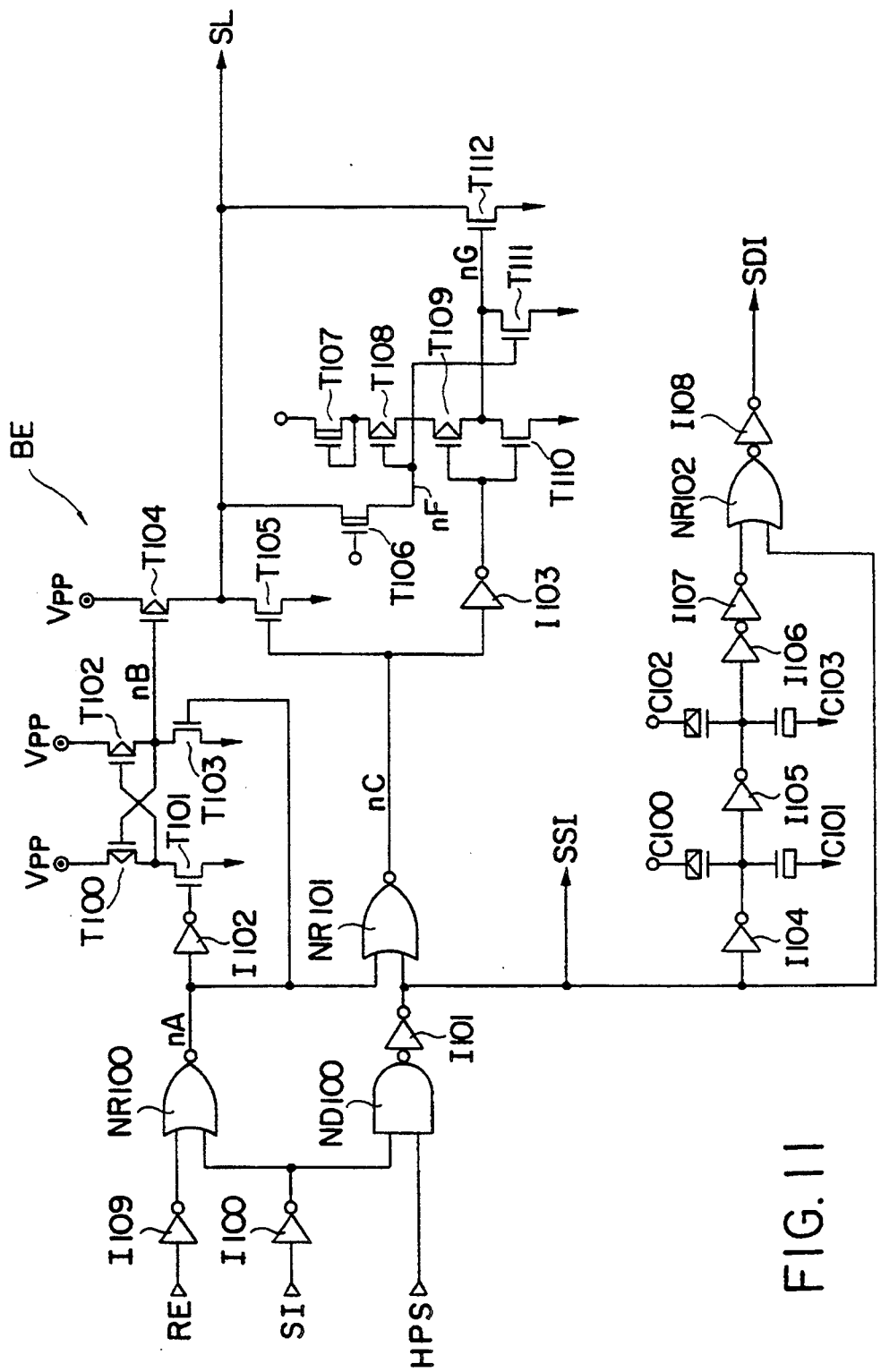
FIG. 11 is a circuit diagram showing an example of the block erase circuit shown in in FIG. 8.

FIG. 11 shows an example of the block erase circuit BEi shown in FIG. 8. SI represents a signal from the decoder for selecting a block. HPS is a signal outputted from the program control circuit PC, which takes a level "H" only during the program operation. RE is a signal outputted from the erase control circuit EC, which takes a level "H" only during the erase operation.

The charge/discharge operation for the source line SL will be described below with reference to FIG. 15.

Charging the source line SL is performed by a transistor T104 to which an output node nB of a level shifter logic circuit is connected. The level shifter logic circuit is constructed of elements I100, I109, NR100, T100 to T103, and I102. When the node nB takes a level "H", the transistor T104 turns off, and the source line SL will not be charged. When the node nB takes a level "L", the transistor T104 turns on, and the source line SL is charged. Discharging the source line SL is performed by a logic circuit having elements ND100, I101, and NR101, a transistor T105 connected to an output node nC of the logic circuit, an inverter I103 whose input is connected to the node nC, and a transistor T112 to the gate of which an output node nG of a source potential detecting circuit is connected, the source potential detecting circuit being constructed of transistors T106 to T111. When the node nC and node nG take a level "H", the transistors T105 and T112 turn on, so the source line SL is discharged. A transistor having a small discharge capability is used as the transistor T105, and a transistor having a large discharge capability is used as the transistor T112. The reason for this is to suppress a peak current at the time of discharging the source potential. With such an arrangement, the transistor T105 with a small discharge capability slowly discharges the source line SL during the discharge start period, and after the source potential lowers to some extent, the transistor T112 having a large discharge capability quickly discharges the source line SL. Furthermore, provision of the transistor with a large discharge capability is to suppress a rise of the source potential during the write and read operations. When the nodes nC and nG take a level "L", the transistors T105 and T112 turn off, so the source line will not be discharged. A logic circuit constructed of elements I104 to I108, C100 to C103, and NR102 is a delay circuit for setting the timing of a signal for equalizing the source line SL and data line DL.

Table 3 shows main node voltages at respective signal lines in a selected block and non-selected block during the program, the erase and read operations. In this Table, it is assumed that $V_{cc}$ is 5 V, and $V_{pp}$ is 12 V.

TABLE 3

| Mode | Block | Source Potential SL | SI | HPS | RE | Node nA | Node nB | Node nC | Node nG | SSI | SDI |
| --- | --- | --- | --- | --- | --- | --- | --- | --- | --- | --- | --- |
| Program | Selected Block | 0 V | 5 V | 5 V | 0 V | 0 V | 12 V | 5 V | 5 V | 0 V | 0 V |
|  | Non-selected Block | 2 V | 0 V | 5 V | 0 V | 0 V | 12 V | 0 V | 0 V | 5 V | 5 V |
| Erase | Selected Block | 12 V | 5 V | 0 V | 5 V | 5 V | 0 V | 0 V | 0 V | 0 V | 0 V |
|  | Non-selected Block | 0 V | 0 V | 0 V | 5 V | 0 V | 12 V | 5 V | 5 V | 0 V | 0 V |
| Read | Selected Block | 0 V | 5 V | 0 V | 0 V | 0 V | 12 V | 5 V | 5 V | 0 V | 0 V |
|  | Non-selected Block | 0 V | 0 V | 0 V | 0 V | 0 V | 12 V | 5 V | 5 V | 0 V | 0 V |

Next, the detailed operation at each mode will be described below.

During the program operation, RE="L" at all blocks. The node nB takes a level "H" so that the source line will not be charged from $V_{pp}$. In the selected block, SI="H" and the nodes nC and nG take a level "H". Therefore, the source line SL becomes a discharge state allowing to flow a sufficient program current (several hundred mA) through a selected cell. In the non-selected block, when SI=L, HSP becomes "H", the nodes nC and nG become "L" so that the discharge transistors T105 and T112 turn off. At the same time, SSI and SDI become "H" so that the source line SL and data line DL are equalized. The source line SL is then connected to the stress moderating circuit and set to a potential determined by the stress moderating circuit SE. In this case, the operation of the stress moderating circuit SE starts at the same time when the source line SL and data line DL are equalized. The source/drain junction capacity is fairly large as compared with the capacity of the equalizing transistor TEQ. Therefore, it takes a long time to charge the source line SL and data line DL, so that the potential starts rising under the condition that there is no potential difference between the source line SL and data line DL. At the end of the program operation, HPS becomes "L". Therefore, the discharge transistor T105 first turns on to start discharging the source line SL and data line DL. As the potential of the source line SL lowers and becomes equal to or less than the threshold value $V_{th}$ of the transistor T111, the node nG is gradually charged. After a predetermined time lapse, the discharge transistor T112 also turns on so that the source line SL is sufficiently discharged. In this example, charging the node nG is controlled by the D-type transistor T107.

During the erase operation, HPS="L". In the selected block at SI="H", when RE becomes "H" at the start of the erase operation, the nodes nB, nC, and nG become "L" so that the source line SL is charged from $V_{pp}$. When RE becomes "L" at the end of the erase operation, the nodes nB and nC become "H". Discharge starts first by the discharge transistor T105 with a small discharge capability, and after the source line SL potential becomes equal to or less than a predetermined value, the discharge transistor T112 with a large discharge capability also turns on. Discharge is therefore carried out by the two transistors T105 and T112. In a non-selected block at Si="L", the nodes nB, nC, and nG become "H", and the source line SL is set to 0 V, disabling the erase operation.

During the read and stand-by operations, RE="L" and HPS="L" so that the source line is set to 0 V.

Figure 12:
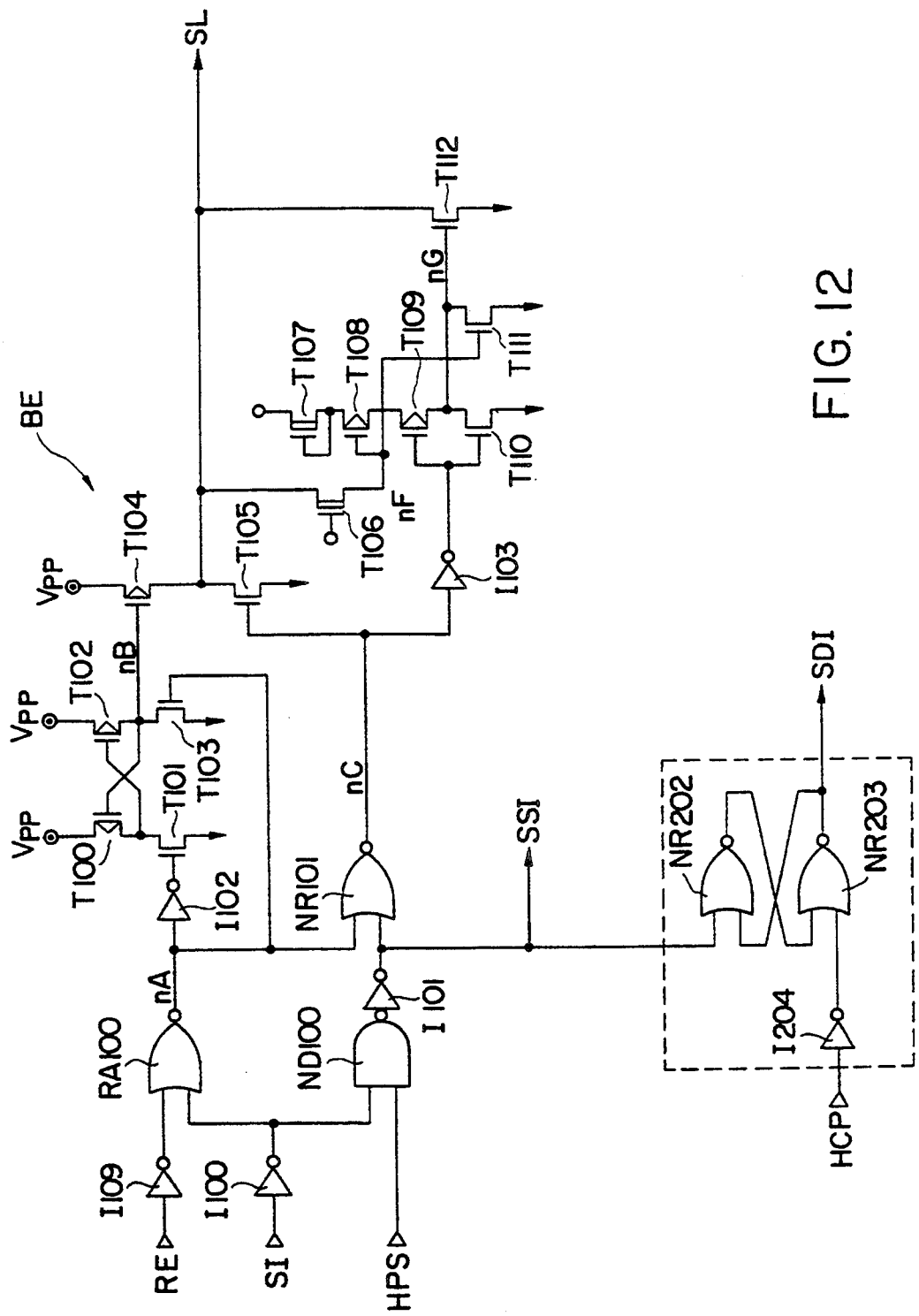
FIG. 12 is a circuit diagram showing another example of the block erase circuit.

FIG. 12 shows another example of the block erase circuit BE. In this circuit, the equalizing signal SDI for the source and data lines is generated not by a delay circuit but by a latch circuit. The signal timings are the same as those of the circuit shown in FIG. 11. In FIG. 12, like elements to those shown in FIG. 11 are represented by using identical reference numerals.

Figure 13:
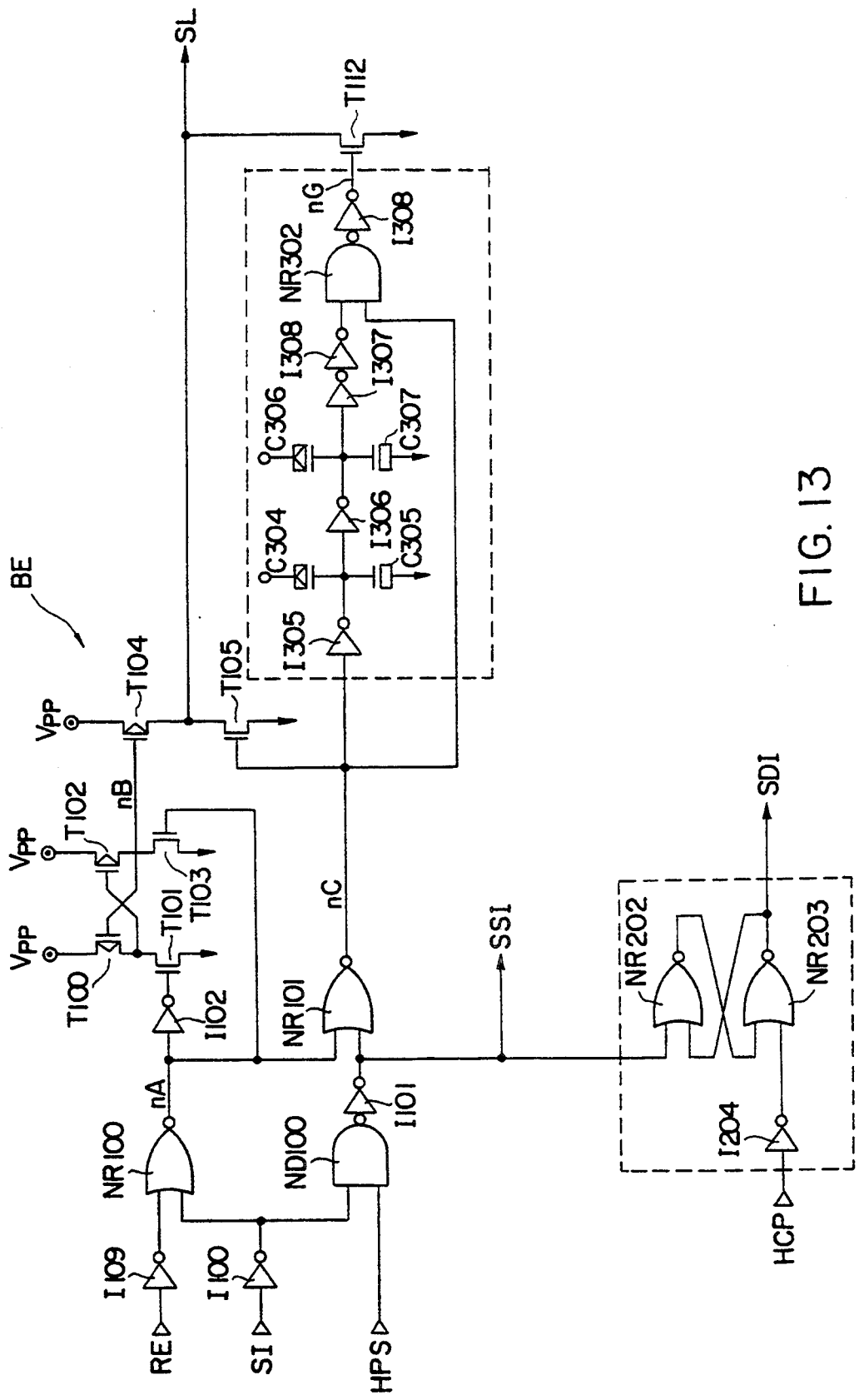
FIG. 13 is a circuit diagram showing another example of the block erase circuit.

FIG. 13 shows another example of the block erase circuit BE. In this example, the source line SL is discharged not by feeding back the source potential but by using a delay circuit having a predetermined delay time. The signal timings are set in the same manner as shown in FIG. 11. In FIG. 13, like elements to those shown in FIG. 12 are represented by using identical reference numerals.

Figure 14:
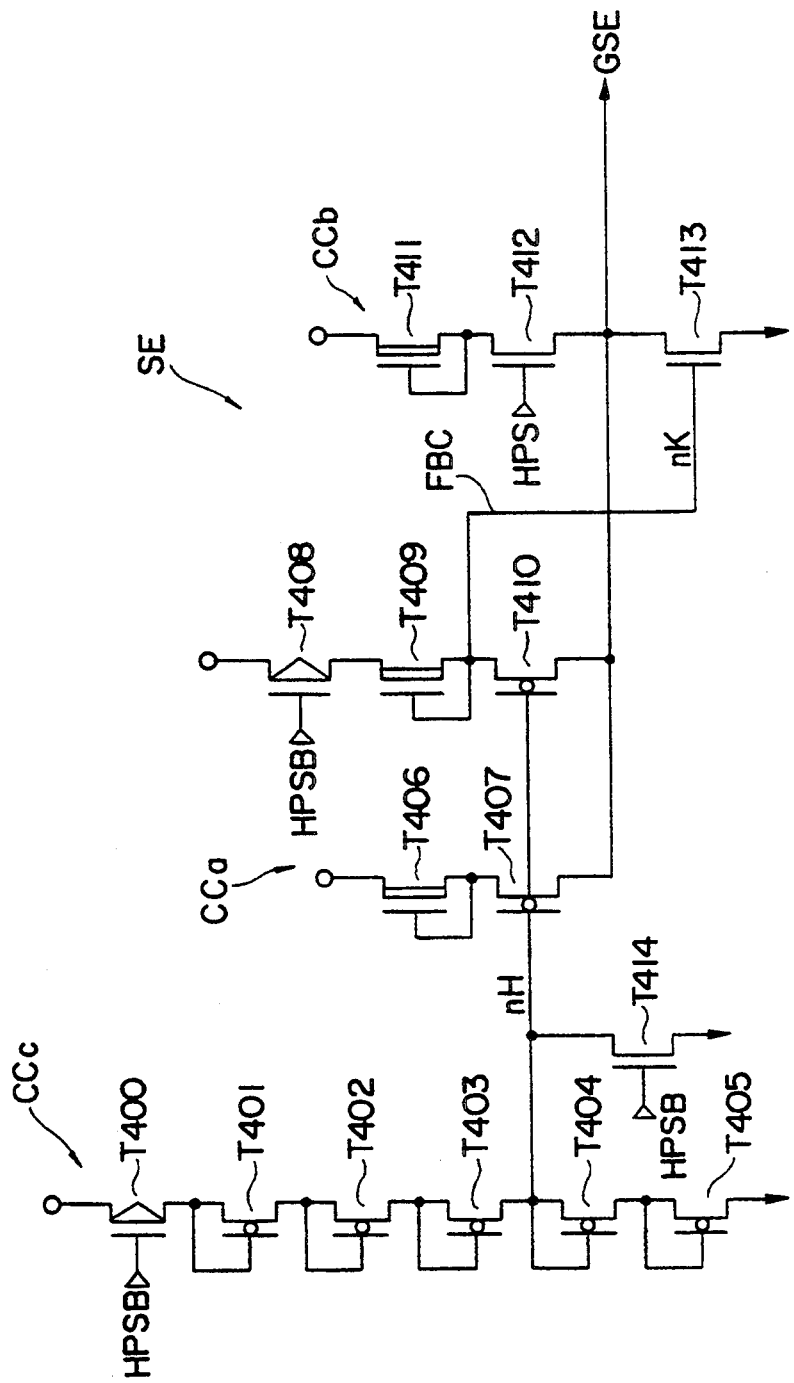
FIG. 14 is a circuit diagram of a stress moderating circuit.

FIG. 14 shows an example of the stress moderating circuit SE shown in FIG. 8. Transistors T400 to T405 constitute a constant voltage circuit CCc for setting the signal GSE. Transistors T406 and T407 constitute a charge circuit $CC_a$, and transistors T411 and T412 constitute another charge circuit $CC_b$. A transistor T413 functions as a discharge transistor. Transistors T408 to T410 constitute a feedback circuit FBC for controlling the gate potential of the discharge transistor T413. A transistor T414 functions as a reset transistor.

The operation of the stress moderating circuit SE shown in FIG. 14 will be described below.

This circuit SE sets the stress moderating potential GES to about 2 V during the program operation, and to 0 V during the operations except the program operation. When HPSB becomes "L", the constant voltage circuit is set up and a node nH is set to a predetermined voltage. In the charge circuits $CC_a$ and $CC_b$, the transistors T407 and T410 turn on to start charging the GSE. When GSE rises to the predetermined value, the charge circuit $CC_a$ stops its charging, and the charge circuit $CC_b$ flows a current determined by a ratio of the discharge transistor T413 and the charge circuit $CC_b$ in the manner described hereinbelow. The feedback circuit FBC lowers gm of the transistor T409 such that the node nK is set nearly to 0 V at the charge start period, and then set to an optional potential Va ($<V_{CC}$: supply voltage) when GSE reaches the predetermined voltage value. The discharge transistor T413 turns off during the charge start period because the gate node nK is set nearly to 0 V. However, as GSE rises, it starts discharging and sets GSE to the predetermined potential in accordance with the ratio of the discharge transistor T413 to the charge circuit $CC_b$.

In this circuit SE, the potential of GSE is determined in accordance with the potential at the node nH of the constant voltage circuit and the threshold values $V_{th}$ of the transistors T407 and T410, and is set to $V_{nH} - V_{th}$ where $V_{nH}$ is a potential at the node nH. In this example, I-type transistors ($V_{th}$ is nearly 0 V) are used as the transistors T407 and T410, so that the potential of GSE is set in accordance with the potential at the output node nH of the constant voltage circuit. In this manner, by changing the parameters of the constant voltage circuit CCc, GSE is set easily to any potential within a range from 1 V to 3 V.

Next, there will be described the relationship between the type of cell array division and power consumption.

Figure 15A:
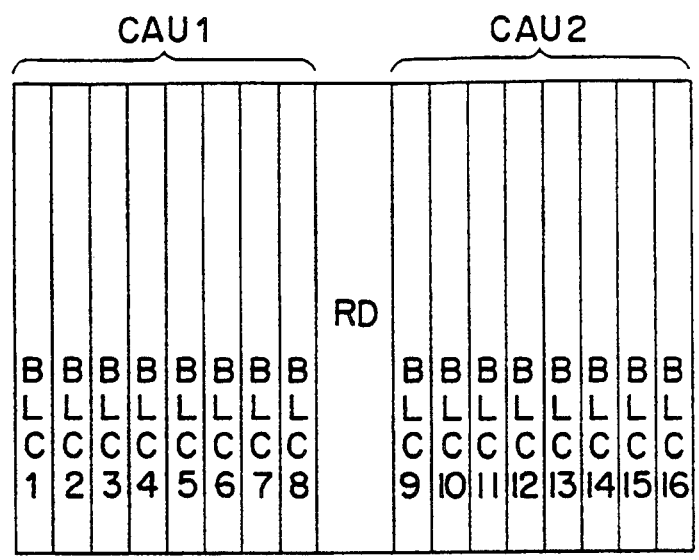
FIGS. 15A and 15B are diagrams explaining the relationship between cell array division and current consumption.

In the cell array shown in FIG. 15A, the array of 4M bit capacity for example is divided into two cell array units CAU1 and CAU2 disposed on opposite sides of a row decoder RD. The cell array unit CAU1 is divided into eight blocks BLC1 to BLC8, and the cell array unit CAU2 is divided into eight blocks BLC9 to BLC16. In the cell array shown in FIG. 15B, the array of 4 M bit capacity for example is divided into four cell array units CAU1 to CAU4, CAU1 and CAU2 being disposed on opposite sides of a row decoder RD1, and CAU3 and CAU4 being disposed on opposite sides of a row decoder RD2. The cell array units CAU1 to CAU4 are divided into four blocks BLC1 to BLC4, BLC5 to BLC8, BLC9 to BLC12, and BLC13 to BLC16, respectively.

Figure 15B:
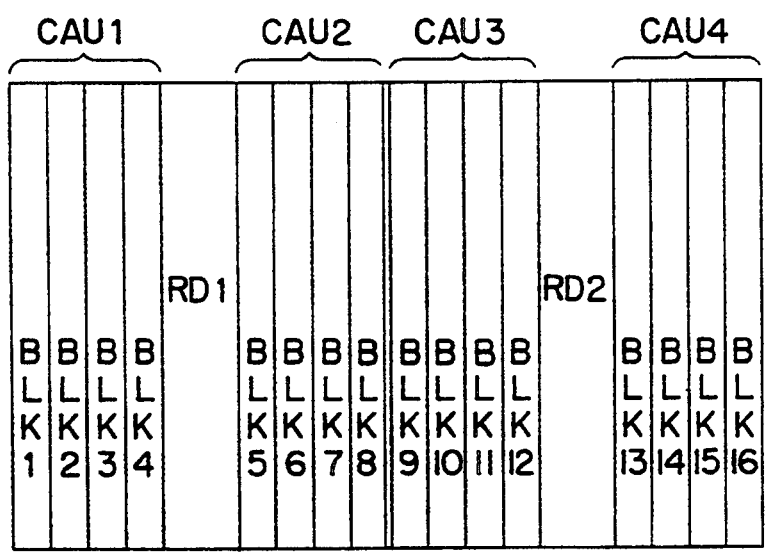

Only a selected cell array unit is driven and a non-selected cell array unit is set in a stand-by state. In this case, no stress is applied to the non-selected cell array unit. Therefore, it is not necessary to apply a stress moderating voltage to the non-selected cell array unit. It is sufficient that the moderating voltage is applied only to a non-selected block in the selected cell array unit. Consider now charge/discharge associated with a stress moderating voltage at a non-selected block in the selected cell array unit. In the case of the two-divided cell array shown in FIG. 15A, there are seven non-selected blocks, and in the case of the four-divided cell array shown in FIG. 15B, there are three non-selected blocks. The junction capacity per one block can be considered to be 800 pF. Therefore, the charge/discharge capacity of the stress moderating circuit for the cell array of FIG. 15A is 5600 pF, and that for the cell array of FIG. 15B is 2400 pF. In order to charge the non-selected block to 2 V in 200 ns, it is required to set the dimension W (channel width) of a charge transistor to 3000 to 5000 μm. therefore, a peak current is about 22 mA for the two-divided cell array, and about 14 mA for the four-divided cell array. In order not to float the source potential in excess of 0.1 V or more even if a program current about 1 mA flows during the program operation, it is required to set the dimension W of the discharge transistor to 800 μm or more. If the source potential at 2 V is discharged by using such a discharge transistor, the discharge time becomes 100 ns or shorter and the peak current becomes about 600 mA for the two-divided cell array, and about 220 mA for the four-divided cell array. As described above, the type of cell array division considerably influences current consumption. For example, the current consumption of the two-divided cell array of FIG. 15A is 1.5 to 2.5 times as large as that of the four-divided cell array of FIG. 15B. Furthermore, there is associated with a problem that the peak current is very large. In view of this, according to the present embodiments, in the case of the four-divided cell array of FIG. 15B, the peak current is suppressed to about 10 mA or less by using a D-type charge transistor. In addition, first and second transistors having small and large discharge capabilities are used. Only the first discharge transistor with a small discharge capability is used during the discharge start period. Thereafter, the first and second discharge transistors with small and large discharge capabilities are used at the same time. In this manner, the peak current per one block is suppressed to about 2 mA or less. As above, according to the present embodiments, there is used a combination of dividing a cell array and suppressing the peak current, thereby reducing power consumption and realizing high speed operation.

As described above, according to the present embodiments, during data write into a selected block, stress applied to a memory cell in a non-selected block is moderated, and at the same time, the source and drain of the cell in the non-selected block are equalized. As a result, current will not flow through a non-selected cell, suppressing an occurrence of write error in the non-selected block.

Next, another embodiment will be described wherein a potential is set without allowing a cell current to flow in a non-selected cell during the erase operation, thereby preventing malfunction of the non-selected cell. In this embodiment, in order to realize such a function, prior to applying an erase mode potential to the source line SL and word line WL, the source line SL and data line DL are equalized.

Figure 16:
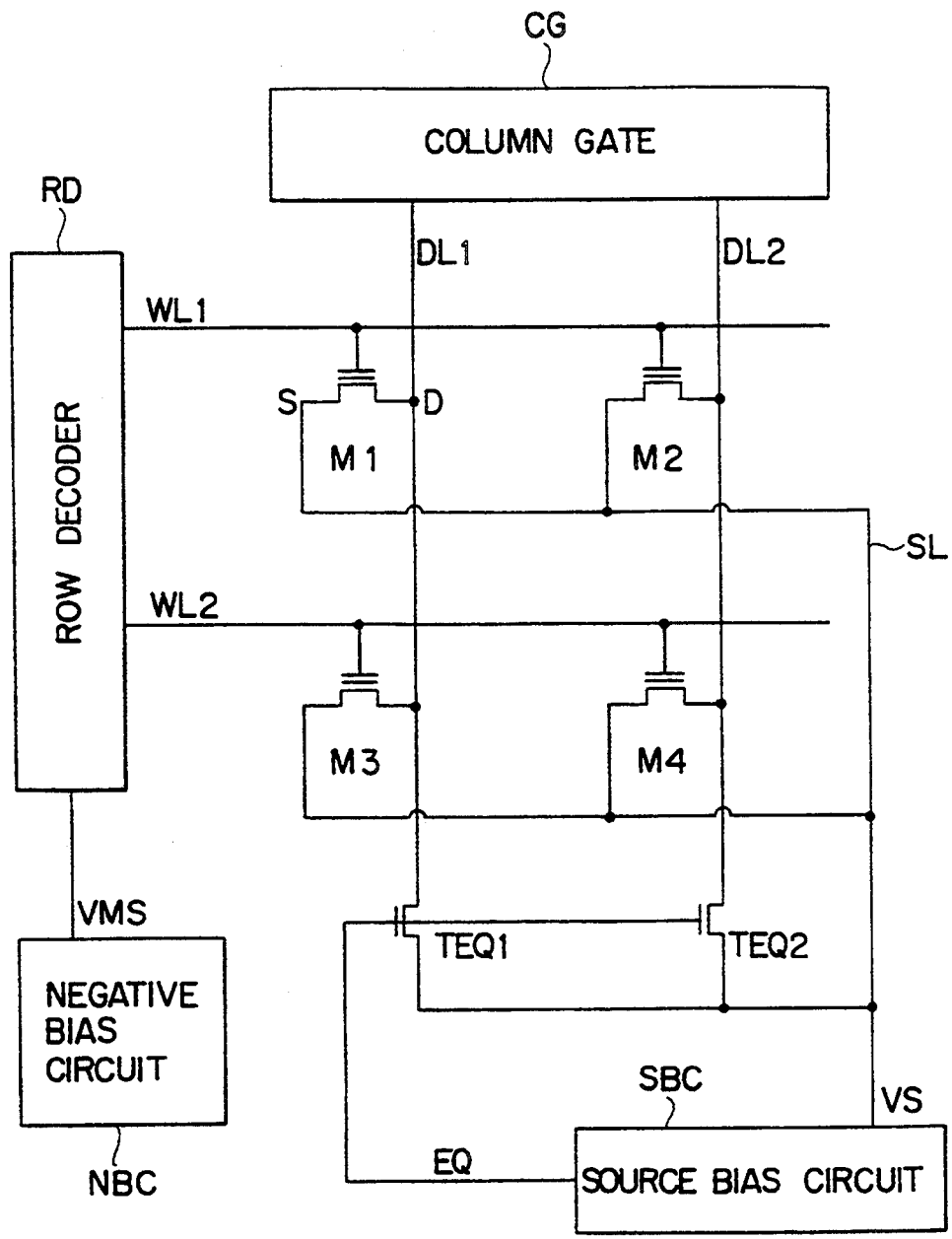
FIG. 16 is a conceptual view showing another embodiment of the present invention.
Figure 17:
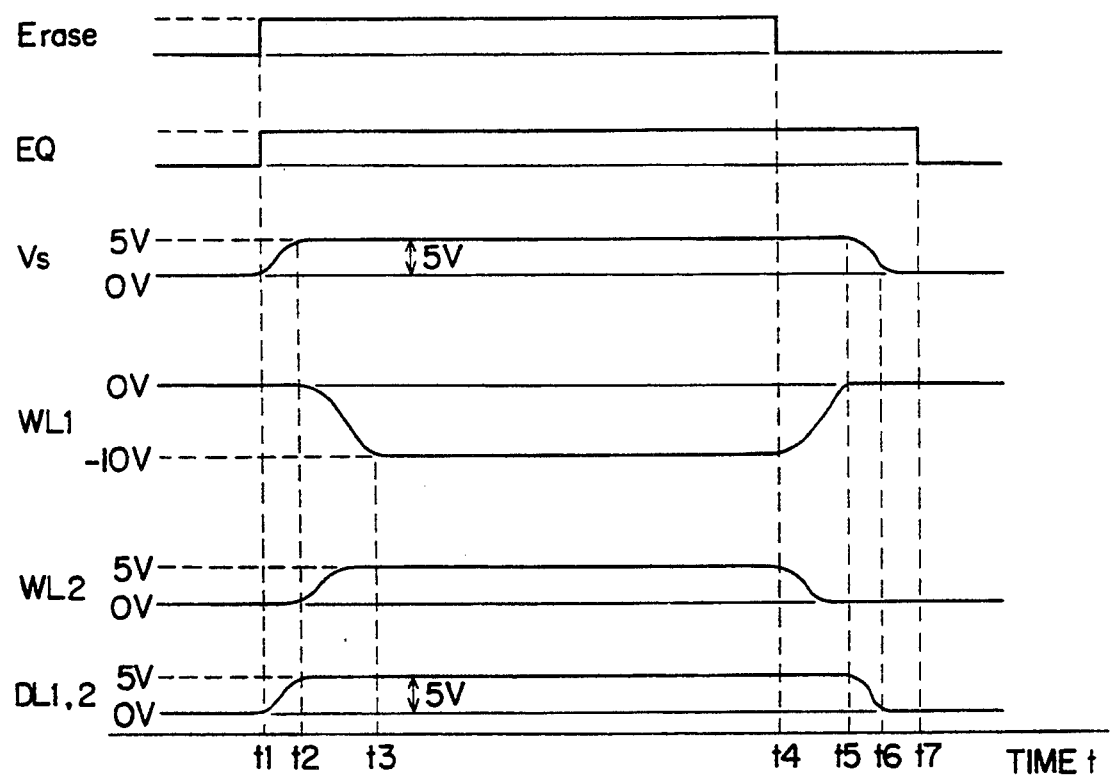
FIG. 17 is a timing chart explaining the operation of the embodiment showin in FIG. 16.

The conceptual diagram illustrating such an embodiment of the present invention is shown in FIG. 16, and its timing chart is shown in FIG. 17. For the erase operation, an erase signal Erase becomes "H" level at time $t_1$. In the erase state, an output EQ of a source bias circuit SSC becomes "H" level. Accordingly, equalizing transistors $TEQ_1$ and $TEQ_2$ turn on to connect together a source lines SL and data lines $DL_1$ and $DL_2$. At time $t_2$, the potential VS of a cell source takes the same potential (e.g., 5 V) as that of the cell drain (data line $DL_1$, $DL_2$). Thereafter, a selected word line (e.g., $WL_2$) are set to predetermined potentials. For example, the selected word line $WL_1$ is set to $-10$ V, and the non-selected word line $WL_2$ is set to 5 V(at time $t_3$). The important points in setting such voltages are that the voltages of the word lines $WL_1$ and $WL_2$ are set after completely equalizing the potentials of the source and drain, and that a cell current is not allowed to flow while charging the word line $WL_2$ of the non-selected cell to 5 V.

After the end of data erase at time $t_4$, discharging the word lines $WL_1$ and $WL_2$ is completed at time $t_5$, and thereafter the source line SL and data lines $DL_1$ and $DL_2$ are discharged. After completion of discharging the source line SL and data lines $DL_1$ and $DL_2$, the equalization is released at time $t_7$. With such timing settings, a cell current will not flow during the time periods from $t_1$ to $t_3$ and from $t_4$ to $t_6$, thereby preventing write error in a non-selected cell.

As the degree of integration becomes high, the capacities of source lines, data lines, and word lines also increase. In such conditions, if rapid charge/discharge is carried out for data erase, an excessive current will flow to source lines, data lines, and word lines, leaving a fear of breaking the chip. In view of this, according to the present embodiments, gentle charge/discharge is performed.

TABLE 4

| Mode | Cell | Voltages of the Invention | | | | |
|------|------|----|----|--------|----|-------|
| | | WL | DL | Source | SW | Erase |
| Erase | Selected Cell | −10 | 5 | 5 | 5 | 5 |
| | Non-selected Cell | 5 | 5 | 5 | 5 | 5 |
| Program | Selected Cell | 12 | 6 | 0 | 12 | 0 |
| | Non-selected Cell | 0 (12) | 0 (6) | 0 | 12 | 0 |
| Read | Selected Cell | 5 | 1 | 0 | 5 | 0 |
| | Non-selected Cell | 0 (5) | 0 (1) | 0 | 5 | 0 |

Table 4 shows examples of setting voltages in various operation modes. While referring to Table 4, there will be described examples of the row decoder RD, negative bis circuit NBC, and source bias circuit SBC, respectively shown in FIG. 16.

Figure 19A:
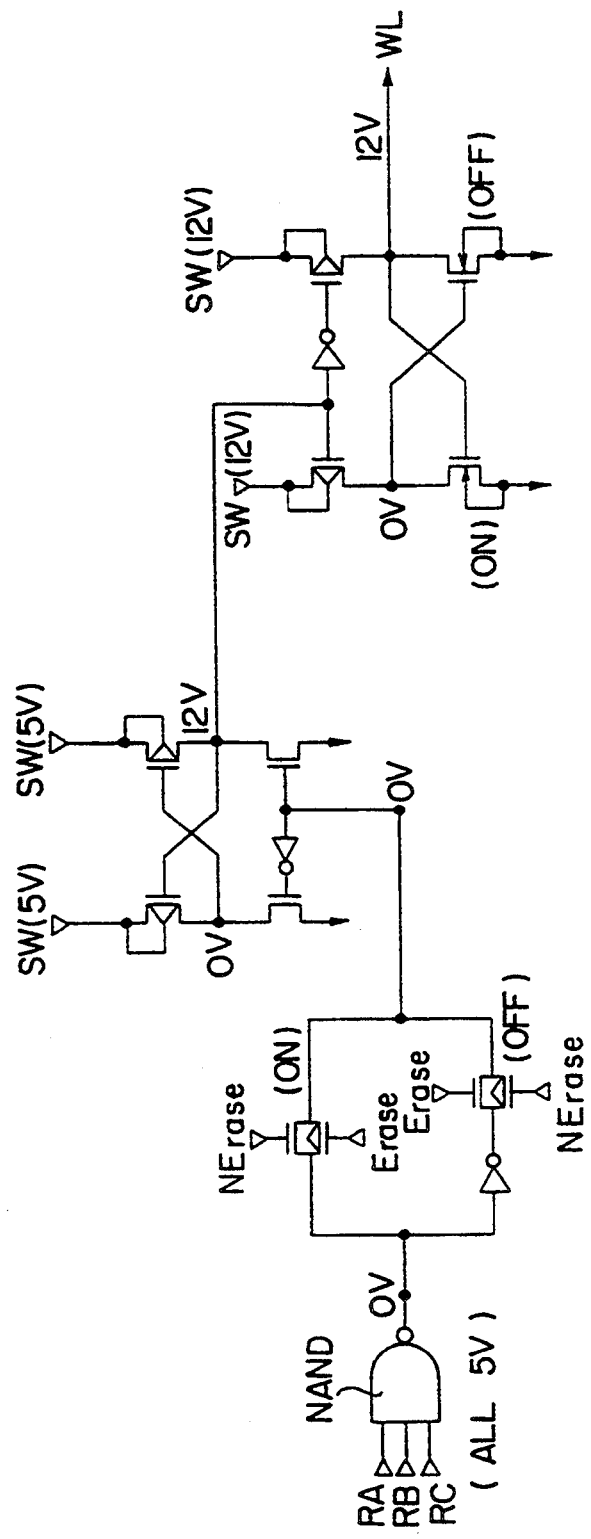
FIGS. 19A and 19B illustrate the states of a selected word line and non-selected word line shown in FIG. 16 during the program mode.
Figure 19B:
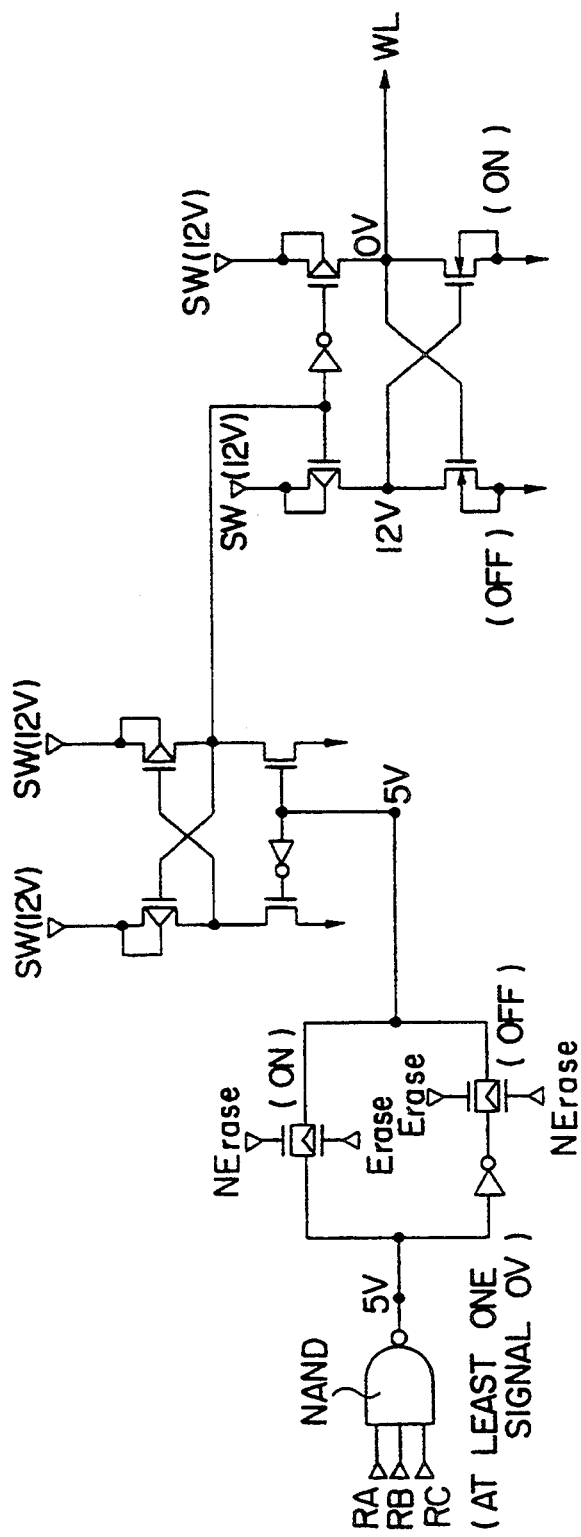
Figure 20:
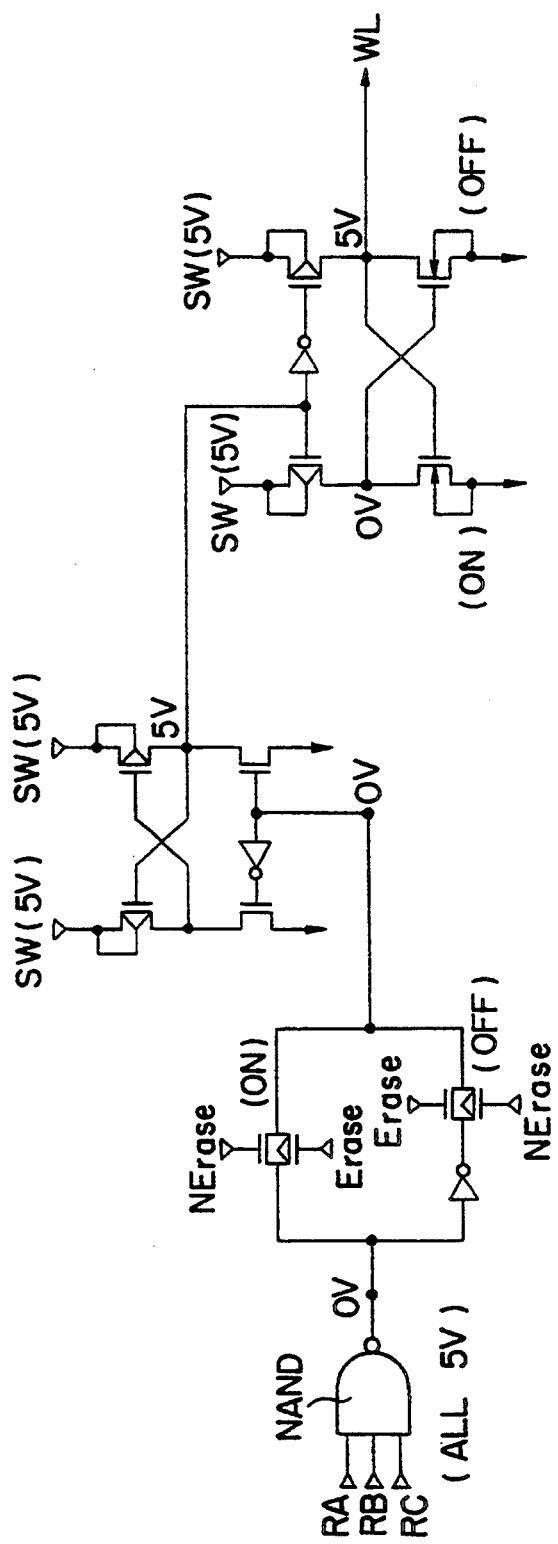
FIG. 20 illustrates the state of the row decoder shown in FIG. 16 during the read mode.

FIGS. 18 to 20 show circuit portions of the row decoder RD.

Figure 18A:
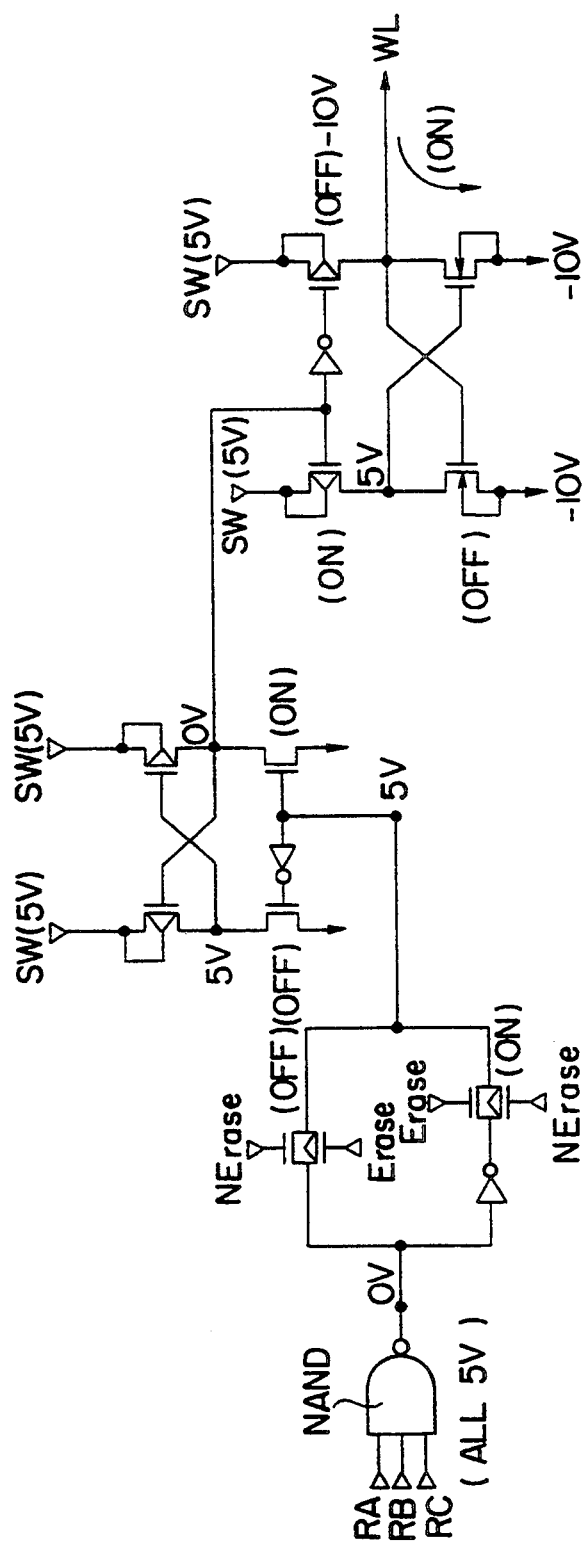
FIGS. 18A and 18B illustrate the states of a selected word line and non-selected word line shown in FIG. 16 during an erase mode.

Specifically, FIG. 18A shows a circuit which generates a potential of $-10$ V to be applied to a selected word line during the erase operation. A NAND gate at the input side of the circuit of FIG. 18A is applied with signals RA, RB, and RC all being 5 V outputted from a pre-decoder to which an address is inputted. The circuit of FIG. 18A operates as illustrated to output $-10$ V as an output WL. The operation of the circuit of FIG. 18A is well known by those skilled in the art, so the detailed description thereof is omitted.

Figure 18B:
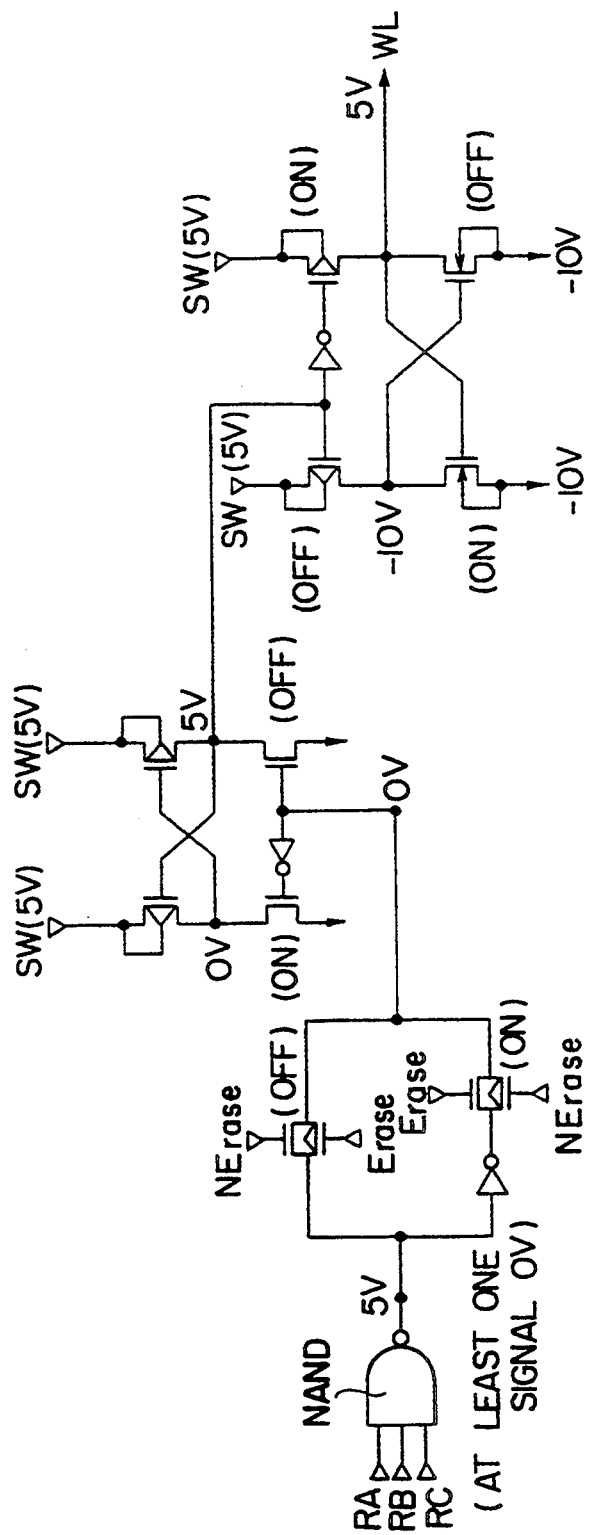

FIG. 18B shows a circuit which generates a potential of 5 V to be applied to a non-selected word line during the erase operation. A NAND gate at the input side is applied with three signals RA, RB, and RC, at least one of which is 0 V. The circuit of FIG. 18B operates as illustrated to output 5 V as an output WL.

FIG. 19A shows a circuit which generates a potential of 12 V to be applied to a selected word line during the program operation. A NAND gate at the input side is applied with signals all being 5 V. The circuit of FIG. 19A operates as illustrated to output 12 V as an output WL.

FIG. 19B shows a circuit which generates a potential of 0 V to be applied to a non-selected word line during the program operation. A NAND gate at the input side is applied with three signals RA, RB, and RC, at least one of which is 0 V. The circuit of FIG. 19B operates as illustrated to output 0 V as an output WL.

FIG. 20 shows a circuit which generates a potential of 5 V to be applied to a selected word line during the read operation. A NAND gate at the input side is applied with signals RA, RB, and RC all being 5 V. The circuit of FIG. 20 operates as illustrated to output 5 V as an output WL.

Figure 21B:
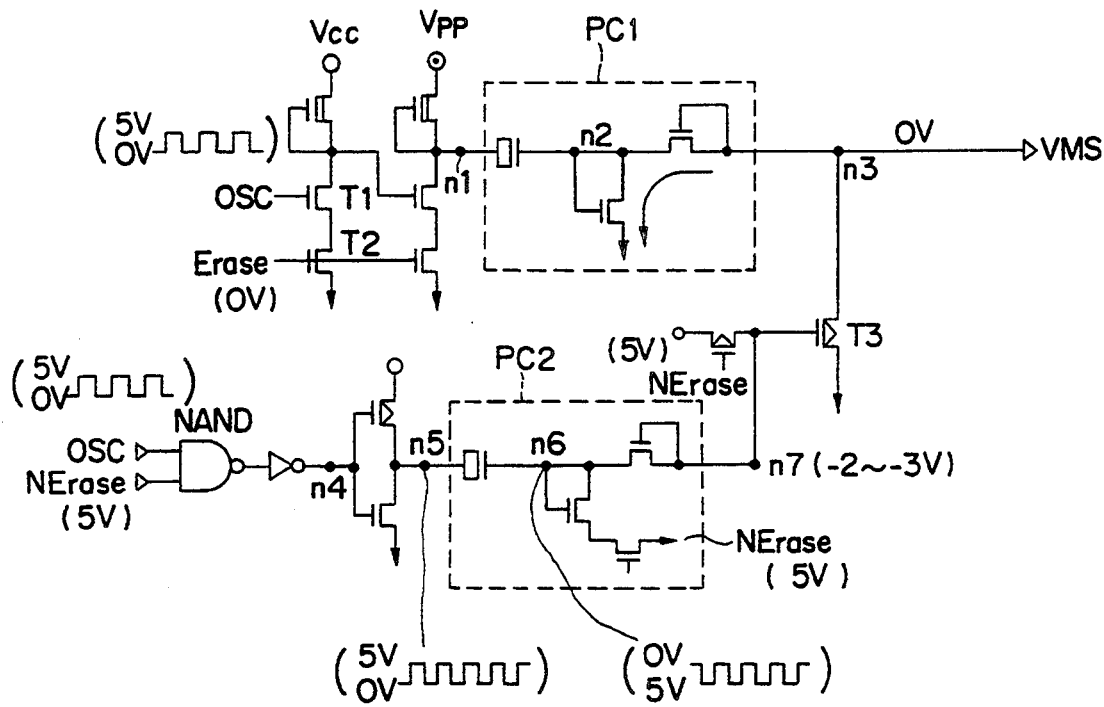

FIGS. 21A and 21B show examples of the negative bias circuit NBC. FIG. 21A shows a circuit which generates $-10$ V as an output VMS during the erase operation. Specifically, during the erase operation, clocks OSC oscillating between 0 and 5 V as shown is applied to a transistor T1, and an erase signal (5 V) is applied to a transistor T2. As a result, an oscillation signal 0 to 12 V as shown appears at a node n1. This oscillation signal is inputted to a pump circuit PC1 at the next stage which then starts operating. An oscillation signal 0 to ($-12$ V) as shown appears at a node n2 of the pump circuit PC1. To one input terminal of a NAND gate, clocks OSC oscillating between 0 and 5 V as shown are inputted, and to the other input terminal, a non-erase signal (0 V) is inputted. As a result, 0 V appears at a node n4. Therefore, another pump circuit PC2 does not operate. 5 V appears at a node n7 and so a transistor T3 turns off. Accordingly, −10 V is obtained at a node n3 at the output side of the pump circuit PC1 as the output VMS.

FIG. 21B is a circuit which generates 0 V as the VMS during the operations other than the erase operation. In such a mode, the circuit operates in the manner different from that shown in FIG. 21A in that an erase signal (0 V) is inputted to a transistor T2, and a non-erase signal (5 V) is inputted to the input terminal of a NAND gate. In this mode, a voltage lowering pump circuit PC1 does not operate. An oscillation signal oscillating between 0 and 5 V as shown appears at a node n5. A pump circuit PC2 therefore starts operating. An oscillation signal oscillating between 0 and (−5 V) appears at a node n6 in the pump circuit PC2. At a node n7 at the output side of the pump circuit PC2, there appears an oscillation signal oscillating between (−2 V) and (−3 V). As a result, a transistor T3 turns on and a node n3 outputs 0 V as a VMS.

Figure 22:
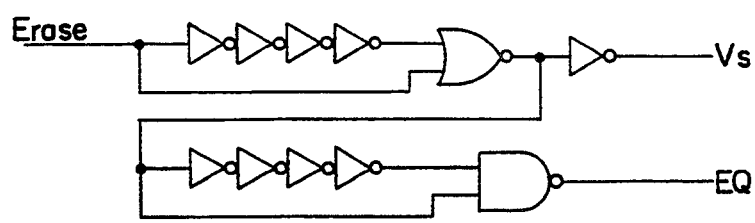
FIG. 22 is a circuit diagram of the source bias circuit shown in FIG. 16.
Figure 25:
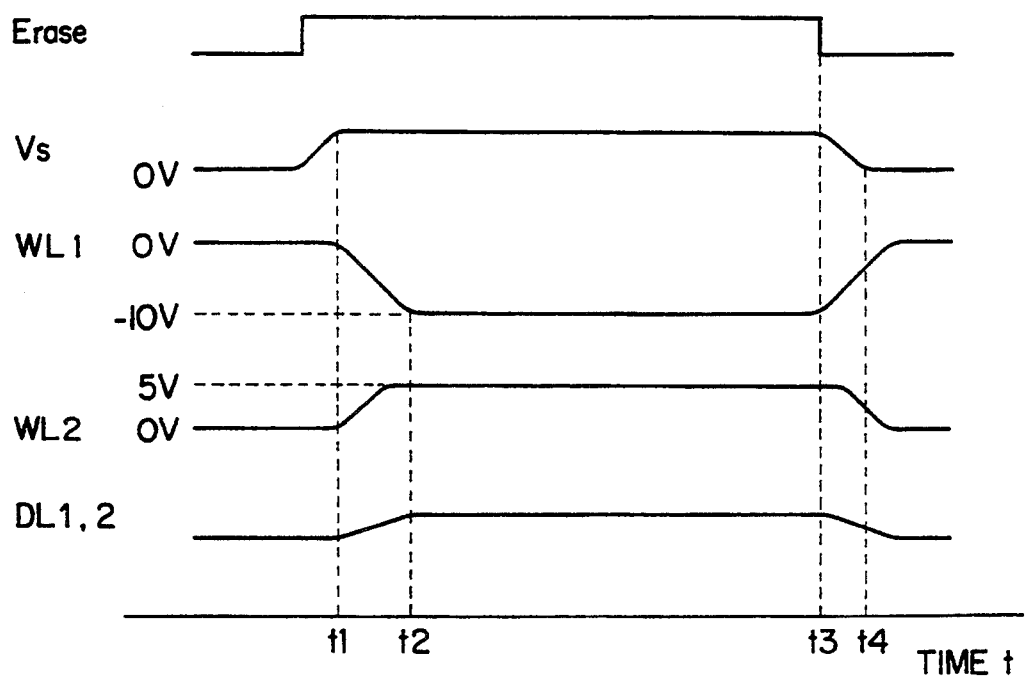
FIG. 25 is a timing chart explaining the operation of the conventional memory device.

FIG. 22 shows an example of the source bias circuit SBC. An output $V_5$ takes 5 V only during the erase operation, and takes 0 V during the program and read operations.

As a means for suppressing a peak current flowing through word lines, data lines, and source lines, during charge/discharge, there is a method of dividing the cell array as described previously to thereby reduce the capacities of word lines, data lines, and source lines. FIG. 23 is a diagram for realizing such a method. In this example, a cell array is divided into eight cell array units SAU1 to SAU8. Each cell array unit SAUi is divided into n blocks BLK1 to BLKn. In FIG. 23, RD represents a row decoder, and CG represents a column decoder. In the memory device shown in FIG. 23, one of the eight cell array units is selected to drive word lines, source lines, and data lines in only the selected unit. In this manner, power required for charge/discharge can be reduced.

As an alternative means, there is a method of reducing the current drive capabilities of transistors for charging/discharging word lines and source lines, to thereby reduce a charge/discharge current and suppressing a peak current.

We claim:

1. A non-volatile semiconductor memory, comprising:
a memory cell array having a plurality of non-volatile memory cells disposed in a matrix form, each of said memory cells having a corresponding one of a plurality of control gates, floating gates, sources and drains, the control gates of the memory cells on a same row being connected to a same word line, the drains of the memory cells on a same column being connected to a same data line, said memory cell array being divided into a plurality of blocks, each having said memory cells disposed in the matrix form, the sources of the memory cells within each of the same blocks being connected to a common erase line;
a row decoder connected to said plurality of word lines for activating a desired one of said plurality of word lines;
a column gate connected to said plurality of data lines for activating a desired one of said plurality of data lines; and
a plurality of block erase means, each having a plurality of output terminals, one of said plurality of output terminals from each of said block erase means being connected to said common erase line of a corresponding one of said blocks, said block erase means applying a moderating voltage to a predetermined one of said blocks not selected for a data write during a data write mode, and said moderating voltage moderating the stress between said control gates and one of said sources and drains.

2. A non-volatile semiconductor memory according to claim 1, wherein said plurality of blocks are disposed in a row direction, and said word line on each row of each of said blocks is connected to said word line on the same row of one of said blocks other than said one of the blocks which is adjacent to said one of said blocks.

3. A non-volatile semiconductor memory according to claim 2, wherein said block erase means includes a plurality of block erase circuits each corresponding to one of said blocks.

4. A non-volatile semiconductor memory according to claim 3, wherein the drains of the memory cells on the same column are connected to the same data line, and the sources of the memory cells within each of the same blocks are connected to said common erase line.

5. A non-volatile semiconductor memory according to claim 2, wherein the drains of the memory cells on the same column are connected to the same data line, and the sources of the memory cells within each of the same blocks are connected to said common erase line.

6. A non-volatile semiconductor memory according to claim 1, wherein said block erase means includes a plurality of block erase circuits each corresponding to one of said blocks.

7. A non-volatile semiconductor memory according to claim 6, wherein the drains of the memory cells on the same column are connected to the same data line, and the sources of the memory cells within each of the same blocks are connected to said common erase line.

8. A non-volatile semiconductor memory according to claim 1, wherein the drains of the memory cells on the same column are connected to the same data line, and the sources of the memory cells within each of the same blocks are connected to said common erase line.

9. A non-volatile semiconductor memory according to claim 1, wherein said plurality of blocks are disposed in the column direction, and each of said data line on each column of each of said blocks is connected to each of said data line on the same column of one of said blocks other than said one of the blocks which is adjacent to each one of said blocks.

10. A non-volatile semiconductor memory according to claim 9, wherein said block erase means includes a plurality of block erase circuits each corresponding to one of said blocks.

11. A non-volatile semiconductor memory according to claim 10, wherein the control gates of the memory cells on the same row are connected to the same word line, and the sources of the memory cells within the same blocks are connected to said common erase line.

12. A non-volatile semiconductor memory according to claim 9, wherein the control gates of the memory cells on the same row are connected to the same word line, and the sources of the memory cells within each of the same blocks are connected to said common erase line.

13. A non-volatile semiconductor memory according to claim 1, wherein the control gates of the memory cells on the same row are connected to the same word line, and the sources of the memory cells within each of the same blocks are connected to said common erase line.

14. A non-volatile semiconductor memory, comprising:
   a memory cell array having a plurality of nonvolatile memory cells disposed in a matrix form, each of said memory cells having a corresponding one of a plurality of control gates, floating gates, sources and drains, the control gates of the memory cells on a same row being connected to a same word line, the drains of the memory cells on a same column being connected to a same data line, said memory cell array being divided into a plurality of blocks, each having said memory cells disposed in the matrix form, and the sources of memory cells within each of the same blocks being connected to a common erase line;
   a row decoder connected to said plurality of word lines for activating a desired one of said plurality of word lines;
   a column gate connected to said plurality of data lines for activating a desired one of said plurality of data lines;
   a plurality of block erase means, each having a plurality of output terminals, one of said plurality of output terminals from each of said block erase means being connected to said common erase line of a corresponding one of said blocks;
   stress moderating means, connected to said blocks, for applying a moderating voltage to predetermined blocks not selected for a data write during a data write mode, said moderating voltage moderating the stress between said control gates and one of said sources and drains; and
   a plurality of first switching means provided for each of said blocks, for connecting said common erase line of said blocks to said data lines of said blocks, each said first switching means for one of said blocks not selected for the data write turning on during the data write mode.

15. A non-volatile semiconductor memory according to claim 14, further comprising second switching means for connecting said common erase line to said stress moderating means, and said second switching means connecting said common erase line in said one of said blocks not selected for the data write to said stress moderating means during the data write mode.

16. A non-volatile semiconductor memory according to claim 15, wherein said block erase means controls to turn on and off said first and second switching means.

17. A non-volatile semiconductor memory according to claim 16, further comprising control means for controlling said block erase means to cause said first and second switching means to turn on and off for the output control of said common erase line, and for controlling the output of said stress moderating means.

18. A non-volatile semiconductor memory according to claim 17, wherein said control means performs first and second control operations, in said first control operation said control means controls said block erase means to turn on said first switching means corresponding to said one of said blocks not selected during said data write mode prior to raising the potential of said word line connected to said control gates, and to turn off said first switching means corresponding to said one of said blocks not selected after lowering the potential of said word line, and in said second control operation said control means controls said stress moderating means to stop the application of said moderating voltage after lowering the potential of said word line after the data write.

19. A non-volatile semiconductor memory according to claim 18, wherein said control means controls to turn off said second switching means after the stop of the application of said moderating voltage, and thereafter turn on said first switching means.

20. A non-volatile semiconductor memory according to claim 19, wherein said block erase means includes a plurality of block erase circuits, each corresponding to each of said blocks.

21. A non-volatile semiconductor memory having a plurality of non-volatile memory cells, each having a corresponding one of a plurality of control gates, floating gates, sources and drains, data in each of said memory cells being erased by applying a negative voltage to the control gates of said memory cells, comprising:
   a memory cell array comprising said plurality of memory cells disposed in a matrix form, the control gates of the memory cells on a same row being connected to a same word line, the drains of the memory cells on a same column being connected to a same data line, and the sources of the memory cells being connected to a common erase line;
   a row decoder connected to said plurality of word lines for activating a desired one of said plurality of word lines;
   a column gate connected to said plurality of data lines for activating a desired one of said plurality of data lines;
   a plurality of switching means each connected between one of said date lines and said common erase line for connecting said common erase line to said plurality of data lines; and
   source biasing means, connected to said plurality of switching means and control terminals of the switching means for applying a source potential to said common erase line and applying a turning on signal to said plurality of the switching means to turn on said plurality of switching means to connect said common erase line and said data lines, during an erase mode.

22. A non-volatile semiconductor memory according to claim 21, wherein said source biasing means controls to turn on said switching means for connecting together the sources and drains of the memory cells, during said erase mode prior to lowering the potentials of said control gates of memory cells to be erased and prior to raising the potential of said control gates of memory cells not selected, to thereby equalize said sources and drains, and controls to stop the application of said source potential outputted from said source biasing means, after the erase operation, after raising the potentials of said control gates of said selected memory cells and after lowering the potentials of said control gates of said non-selected memory cells.

23. A non-volatile semiconductor memory according to claim 22, wherein said source biasing means controls to turn off said switching means after stopping the application of said source potential.

* * * * *